US012713705B2

(12) United States Patent
Hsu et al.

(10) Patent No.: US 12,713,705 B2

(45) Date of Patent: Aug. 18, 2026

(54) INTEGRATED CIRCUIT DEVICE AND METHOD OF MANUFACTURING

(71) Applicant: TAIWAN SEMICONDUCTOR MANUFACTURING COMPANY, LTD., Hsinchu (TW)

(72) Inventors: Chia-Lin Hsu, Hsinchu (TW); Yu-Ti Su, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 554 days.

(21) Appl. No.: 18/311,112

(22) Filed: May 2, 2023

(65) Prior Publication Data

US 2024/0371854 A1 Nov. 7, 2024

Related U.S. Application Data

(60) Provisional application No. 63/480,340, filed on Jan. 18, 2023.

(51) Int. Cl.

*H10D 89/60* (2025.01)

*H10D 84/01* (2025.01)

(Continued)

(52) U.S. Cl.

CPC ....... *H10D 89/611* (2025.01); *H10D 84/0156* (2025.01); *H10D 84/038* (2025.01);

(Continued)

(58) Field of Classification Search

CPC ............. H10D 89/611; H10D 84/0156; H10D 84/038; H10D 89/711; H10D 89/811;

(Continued)

(56) References Cited

U.S. PATENT DOCUMENTS

| | | | |
|---|---|---|---|
| 9,490,245 B1 | 11/2016 | Sahu et al. | |
| 11,456,596 B2 * | 9/2022 | Mallikarjunaswamy | H02H 9/046 |

(Continued)

FOREIGN PATENT DOCUMENTS

| | | |
|---|---|---|
| DE | 10 2019 123 521 | 3/2020 |
| KR | 10-2014-0044466 | 4/2014 |

(Continued)

*Primary Examiner* — Yasser A Abdelaziez

(74) *Attorney, Agent, or Firm* — Hauptman Ham, LLP

(57) ABSTRACT

An integrated circuit (IC) device includes a substrate, first and second semiconductor devices correspondingly in different first and second doped regions in the substrate. A gate of the first semiconductor device is electrically coupled to a source/drain of the second semiconductor device. The IC device further includes a first protection device configured as one of a first forward diode and a first reverse diode, and a second protection device configured as the other of the first forward diode and the first reverse diode. The first forward diode and the first reverse diode are electrically coupled in series between the substrate and a doped well. The doped well is in the first doped region and a source/drain of the first semiconductor device is in the doped well. Alternatively, the doped well is in the second doped region, and the source/drain of the second semiconductor device is in the doped well.

20 Claims, 18 Drawing Sheets

(51) Int. Cl.
*H10D 84/03* (2025.01)
*H03K 17/08* (2006.01)

(52) U.S. Cl.
CPC ......... *H10D 89/711* (2025.01); *H10D 89/811* (2025.01); *H10D 89/921* (2025.01); *H03K 17/08* (2013.01)

(58) Field of Classification Search
CPC ........ H10D 89/921; H10D 8/00; H10D 8/411; H10D 89/60; H10D 89/931; H03K 17/08
See application file for complete search history.

(56) References Cited

U.S. PATENT DOCUMENTS

| | | | | |
|---|---|---|---|---|
| 2006/0226485 | A1 | 10/2006 | Arakawa | |
| 2014/0264520 | A1* | 9/2014 | Reisiger ............... | H10D 89/811<br>438/585 |
| 2017/0338304 | A1* | 11/2017 | Janssens .............. | H10D 62/114 |
| 2019/0103396 | A1* | 4/2019 | Zhan .................... | H10D 62/133 |
| 2019/0237459 | A1 | 8/2019 | Hura | |
| 2020/0083212 | A1 | 3/2020 | Zhao et al. | |
| 2020/0194423 | A1 | 6/2020 | Nandakumar et al. | |
| 2020/0273856 | A1* | 8/2020 | Lee ...................... | H10D 89/713 |

FOREIGN PATENT DOCUMENTS

| | | |
|---|---|---|
| KR | 20160046552 | 4/2016 |
| KR | 10-2018-0002878 | 1/2018 |
| TW | 201428927 | 7/2014 |
| TW | 201818545 | 5/2018 |

* cited by examiner 500B
527
CN
BN
528
EN
516
N
PW
511
510
N-Substrate/DNW
529
Z-axis 500A
517
CN
518
BN
EN
516
N
PW
511
510
N-Substrate/DNW
519
Z-axis 600B
627
CP
BP
628
EP
P
616
NW
611
P–Substrate/DPW
610
629
Z–axis 600A
617
CP
618
BP
EP
P
616
PW
611
P–Substrate/DPW
610
619
Z–axis

INTEGRATED CIRCUIT DEVICE AND METHOD OF MANUFACTURING

RELATED APPLICATION(S)

This application claims the benefit of U.S. Provisional Application No. 63/480,340, filed Jan. 18, 2023, which is herein incorporated by reference in its entirety.

BACKGROUND

The recent trend in miniaturizing integrated circuit (IC) devices has resulted in smaller semiconductor devices which consume less power, yet provide more functionality at higher speeds. The miniaturization process has also increased the semiconductor devices' susceptibility to damages due to various factors, such as thinner gate dielectric thicknesses, lowered dielectric breakdown voltages, or the like. The antenna effect is one of the causes of circuit damages in IC devices, and is a consideration in semiconductor advanced technology.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
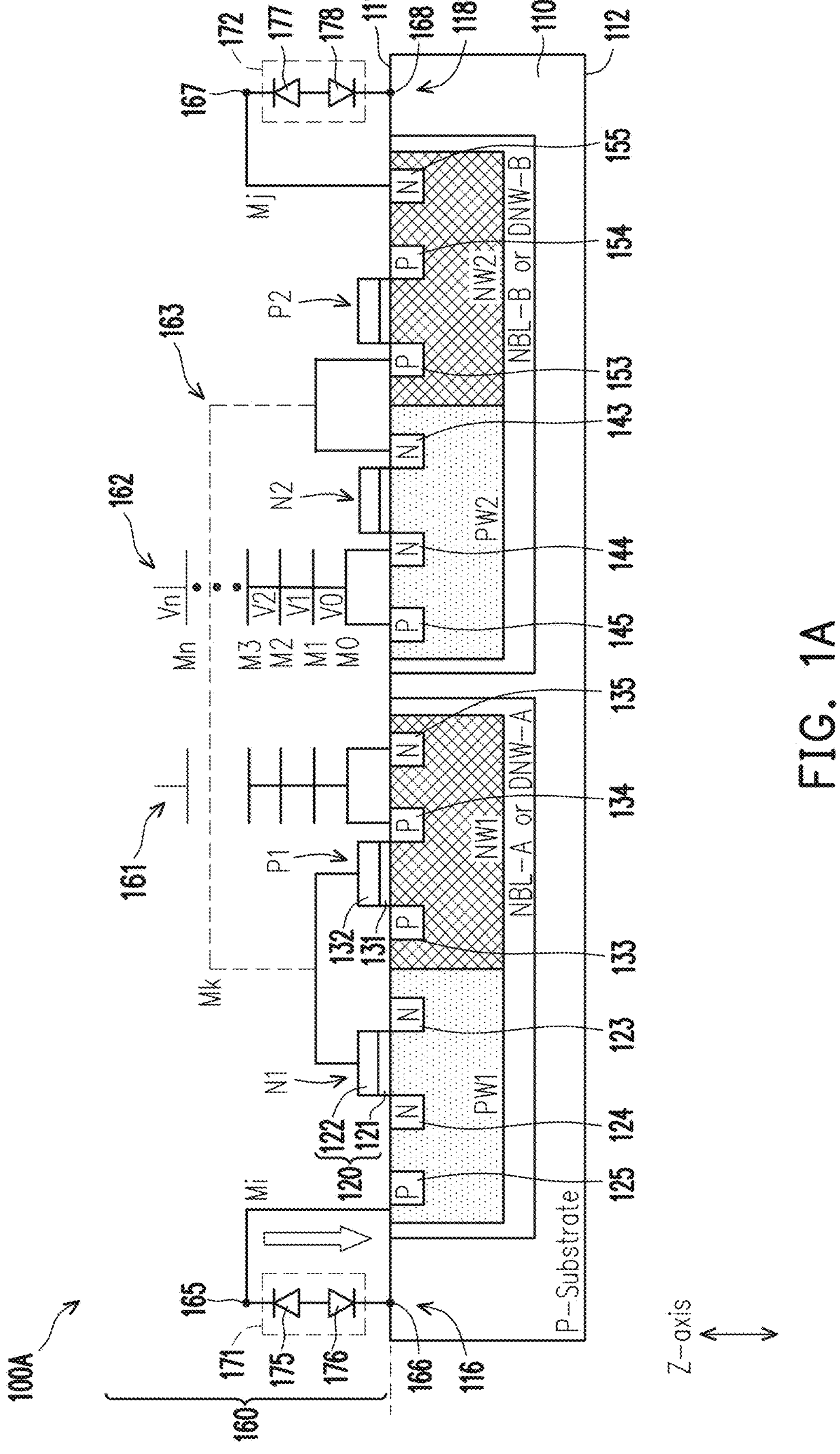
FIG. 1A is a schematic cross-sectional view of an IC device, in accordance with some embodiments.

The following disclosure provides different embodiments, or examples, for implementing features of the provided subject matter. Specific examples of components, materials, values, steps, arrangements, or the like, are described below to simplify the present disclosure. These are, of course, merely examples and are not limiting. Other components, materials, values, steps, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Source/drain(s) may refer to a source or a drain, individually or collectively dependent upon the context.

Further, spatially relative terms, such as "beneath," "below," "lower," "above," "upper" and the like, may be used herein for case of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In a manufacturing process of an IC device, transistors are formed over a substrate. Each of the transistors comprises a gate electrode, and a gate dielectric between the gate electrode and the substrate. The gate dielectric is an oxide or another gate dielectric material. In manufacturing operations subsequent to the formation of transistors, various dielectric and metal layers are deposited and patterned to obtain conductive vias and/or patterns electrically coupled to the gate electrodes of the transistors. Deposition and/or patterning operations often include plasma operations, such as plasma etching operations, plasma deposition operations, or the like. In plasma operations, it is possible that a sufficient amount of electric charges is accumulated in a conductive pattern, a via, and/or a doped well coupled to a gate electrode, and causes breakdown of the underlying gate dielectric and damage to the corresponding transistor. This issue is referred to as "plasma induced gate oxide damage" (PID), or "antenna effect," which potentially causes yield and/or reliability concerns during a semiconductor manufacturing process. PID issues include metal-PID issues and well-PID issues. Metal-PID issues are PID issues related to electric charges accumulated on metal features, such as conductive patterns and/or vias. Well-PID issues are PID issues related to electric charges accumulated in doped wells over which gates and gate dielectrics are formed, or to which gates are electrically coupled. PID protection circuits and/or PID protection devices are included in IC devices to protect other transistors and/or circuits from being damaged due to the antenna effect or PID.

In some embodiments, a PID protection circuit in an IC device comprises at least one pair of PID protection devices correspondingly configured as a forward diode and a reverse diode electrically coupled in series between a doped well and a substrate over which the doped well is formed. Examples of PID protection devices include, but are not limited to, N-type diodes, P-type diodes, diode-connected metal-oxide semiconductor (MOS) transistors, diode-connected bipolar junction transistors (BJTs), or any device having or configuring a P-N junction. In at least one embodiment, the reverse diode is configured to discharge electric charges, which are accumulated in the doped well during manufacture of the IC device, to the substrate by a leakage current of the reverse diode. As a result, in one or more embodiments, well-PID issues are avoidable or mitigated, especially in certain process nodes and/or circuit designs where well-PID issues raise concerns due to large differences in well sizes. In at least one embodiment, the forward diode is configured to, by itself or in combination with the reverse diode, withstand a working voltage applied across the doped well and the substrate in operation of the IC device. As a result, in one or more embodiments, it is possible to satisfy direct current (DC) requirements related to the working voltage, in addition to the PID requirements.

This is an improvement over other approaches where a single diode for discharging electric charges accumulated in a doped well may not be sufficient to sustain a high working voltage, e.g., 36 V, in operation. In some embodiments, it is possible to achieve one or more further advantages including, but not limited to, low chip area impact, no impact on functions and/or operations of IC devices, no electrostatic discharge (ESD) concerns, suitability for various designs with different voltage applications, suitability for every technology node (or process node), or the like.

FIG. 1A is a schematic cross-sectional view of an IC device 100A, in accordance with some embodiments.

The IC device 100A comprises a substrate 110 having a front side 111 and a back side 112 in a thickness direction of the IC device 100A. The thickness direction is designated as Z-axis in the drawings. In the example configuration in FIG. 1A, the substrate 110 is a P-type substrate (also referred to as P-substrate). In some embodiments, the substrate 110 comprises an elemental semiconductor including silicon or germanium in crystal, polycrystalline, or an amorphous structure; a compound semiconductor including silicon carbide, gallium arsenic, gallium phosphide, indium phosphide, indium arsenide, and indium antimonide; an alloy semiconductor including SiGe, GaAsP, AlInAs, AlGaAs, GaInAs, GaInP, and GaInAsP; any other suitable material; combinations thereof, or the like. In some embodiments, the alloy semiconductor substrate has a gradient SiGe feature in which the Si and Ge composition change from one ratio at one location to another ratio at another location of the gradient SiGe feature. In some embodiments, the alloy SiGe is formed over a silicon substrate. In some embodiments, the substrate 110 comprises a strained SiGe substrate. In some embodiments, the semiconductor substrate has a semiconductor on insulator structure, such as a silicon on insulator (SOI) structure. In some embodiments, the semiconductor substrate includes a doped epi layer or a buried layer. In some embodiments, the compound semiconductor substrate has a multilayer structure, or the substrate includes a multilayer compound semiconductor structure. In at least one embodiment, the substrate 110 comprises an N-type substrate (also referred to as N-substrate). One of the N-type and P-type is an example of a first conductivity, and the other of the N-type and P-type is an example of a second conductivity opposite to the first conductivity. A region having the conductivity of the P-type is a P-type region. Examples of a P-type region include, but are not limited to, a region of a P-type substrate, a P-doped region, a P-well, or the like. A region having the conductivity of the N-type is an N-type region. Examples of an N-type region include, but are not limited to, a region of an N-type substrate, an N-doped region, an N-well, or the like.

The IC device 100A further comprises, over the front side 111 of the substrate 110, a first doped region NBL-A, and a second doped region NBL-B. The doped region NBL-B is different from the doped region NBL-A. For example, the doped region NBL-B is physically and/or electrically separated from the doped region NBL-A by an isolation structure, e.g., a shallow trench isolation (STI) region. In another example, the doped region NBL-B is not continuous to the doped region NBL-A. In the example configuration in FIG. 1A, each of the doped region NBL-A and the doped region NBL-B is an N-type doped region, which is a volume within the substrate 110 including one or more n-type dopants, e.g., phosphorous or arsenic, having a doping concentration sufficient to form a P-N junction with the surrounding portions of the substrate 110. In some embodiments, an N-type doped region is referred to as an N+ buried layer (NBL) or a deep N-well (DNW), and the doped region NBL-A and doped region NBL-B are sometimes correspondingly referred to as a doped region DNW-A and a doped region DNW-B. In at least one embodiment, for example, when the substrate 110 is an N-type substrate, at least one of the doped region NBL-A or doped region NBL-B is a P-type doped region, e.g., a deep P-well (DPW). The described number and/or conductivity type of doped regions over the substrate 110 are examples. Other doped region configurations are within the scopes of various embodiments.

The doped region NBL-A comprises therein a P-well PW1 and an N-well NW1. The doped region NBL-B comprises therein a P-well PW2 and an N-well NW2. In some embodiments, the IC device 100A further comprises isolation structures (not shown) electrically isolating adjacent P-wells and N-wells, e.g., electrically isolating the P-well PW1 from the N-well NW1 and/or the P-well PW2 from the N-well NW2. In at least one embodiment, the P-well PW1 and the N-well NW1 together form a P-N junction, and/or the P-well PW2 and the N-well NW2 together form a P-N junction. A P-well, e.g., the P-well PW1 or P-well PW2, is a volume within the corresponding doped region that comprises one or more P-type dopants having a doping concentration sufficient to form one or more N-type semiconductor devices thereover. An N-well, e.g., the N-well NW1 or N-well NW2, is a volume within the corresponding doped region that comprises one or more N-type dopants having a doping concentration sufficient to form one or more P-type semiconductor devices thereover. P-wells (designated with a label “PW” in the drawings) and N-wells (designated with a label “NW” in the drawings) are examples of doped wells. In the example configuration in FIG. 1A, a transistor P1 and a transistor P2 are examples of P-type semiconductor devices formed over the corresponding N-well NW1 and N-well NW2, and a transistor N1 and a transistor N2 are examples of N-type semiconductor devices formed over the corresponding P-well PW1 and P-well PW2. Other semiconductor device configurations, such as diodes, are within the scopes of various embodiments.

Semiconductor devices in the P-wells and/or N-wells over the substrate 110 are electrically coupled to each other, as described herein, to form one or more functional circuits. A functional circuit is configured to perform an intended function of the IC device 100A, e.g., data processing, data storage, input/output (I/O), or the like. Examples of one or more circuits, logics, or cells included in a functional circuit include, but are not limited to, AND, OR, NAND, NOR, XOR, INV, OR-AND-Invert (OAI), MUX, Flip-flop, BUFF, Latch, delay, clock, memory such as static random-access memory (SRAM), de-coupling capacitor, analog amplifier, logic driver, digital driver, or the like. In some embodiments, the circuits, logics, or cells included in functional circuits include functional transistors or core transistors which are to be protected from the antenna effect during the manufacture of the IC device 100A. Examples of transistors in the functional circuits, as well as in the other circuits described herein, include, but are not limited to, metal oxide semiconductor field effect transistors (MOSFET), complementary metal oxide semiconductors (CMOS) transistors, P-channel metal-oxide semiconductors (PMOS), N-channel metal-oxide semiconductors (NMOS), bipolar junction transistors (BJT), high voltage transistors, high frequency transistors, P-channel and/or N-channel field effect transistors (PFETs/NFETs), FinFETs, planar MOS transistors with raised source/drains, nanosheet FETs, nanowire FETs, or the like.

Besides functional circuits, the IC device 100A further comprises one or more PID protection circuits, as described herein.

A semiconductor device comprises a gate, and source/drains. A detailed description of the transistor N1 is given herein. Specifically, the transistor N1 comprises a gate structure 120 having a gate dielectric 121 over the P-well PW, and a gate electrode, or gate, 122 over the gate dielectric 121. Example conductive materials of the gate 122 include, but are not limited to, polysilicon, copper (Cu), aluminum (Al), tungsten (W), cobalt (Co), ruthenium (Ru), or the like. Example materials of the gate dielectric 121 include, but are not limited to, silicon dioxide, silicon nitride (Si3N4), a low-k material having a k value less than 3.8, a high-k material having a k value greater than 3.8 such as aluminum oxide (Al2O3), hafnium oxide (HfO2), tantalum pentoxide (Ta2O5), or titanium oxide (TiO2), or the like. In some embodiments, the IC device 100A further comprises sidewalls (not shown in FIG. 1A) on opposite sides of the gate structure 120. Example sidewalls are described with respect to FIGS. 4A-4B.

The transistor N1 further comprises source/drains 123, 124 over the P-well PW1. Each of the source/drains 123, 124 is an N-doped region having N-type dopants implanted in the P-well PW1. In some embodiments, one or more of the source/drains 123, 124 extend above the front side 111 of the substrate 110. In some embodiments, the IC device 100A further comprises lightly doped regions (not shown in FIG. 1A) adjacent to the source/drains 123, 124, and below the sidewalls. In some embodiments, a first element and a second element are adjacent to each other includes scenarios where the first element and the second element are directly next to each other. In some embodiments, a first element and a second element are adjacent to each other includes scenarios where intermediary elements are positioned between the first element and the second element. In some embodiments, lightly doped regions are configured to maintain a low leakage current for the transistor N1. Example lightly doped regions are described with respect to FIGS. 4A-4B.

The IC device 100A further comprises, in the P-well PW1, a body contact 125 which is a P-doped region. In some embodiments, the body contact 125 is configured and/or manufactured in the same manner and/or at the same time as source/drains of P-type semiconductor devices, such as the transistor P1 and transistor P2. A body contact in a doped well is sometimes referred to as a well tap. A body contact in a substrate is sometimes referred to as a substrate tap. A body contact is configured to provide an electrical connection to the corresponding doped well or substrate. For example, the body contact 125 is configured to provide an electrical connection to the P-well PW1. In the example configuration in FIG. 1A, the body contact 125 is configured to provide an electrical connection between the P-well PW1 and a PID protection circuit 171, as described herein. In some embodiments, the P-well PW1 further comprises another body contact configured to electrically couple the P-well PW1 to a reference voltage, e.g., the ground voltage VSS, to prevent leakage of the transistor N1 and/or other N-type semiconductor devices formed over the P-well PW1. In some embodiments, the body contact 125 is configured as a common electrical connection from the P-well PW1 to both the PID protection circuit 171 and VSS. In some embodiments, VSS is provided from a VSS power rail (not shown) on the back side 112 of the substrate 110 to the P-well PW1 through, or without, a well tap on the front side 111. In some embodiments, the source/drain 124 is electrically coupled to the body contact 125.

The transistor P1 over the P-well PW1 is configured similarly to the transistor N1, except that N-type and P-type features (e.g., doped regions, doped wells, or the like) of the transistor P1 correspond to P-type and N-type features of the transistor N1. For example, the transistor P1 comprises a gate dielectric 131, gate 132, source/drains 133, 134, and a body contact 135 corresponding to the gate dielectric 121, gate 122, source/drains 123, 124, and body contact 125 of the transistor N1. The body contact 135 is an N-doped region configured to electrically couple the N-well NW1 to a power supply voltage, e.g., VDD, to prevent leakage of the transistor P1 and/or other P-type semiconductor devices formed over the N-well NW1. In some embodiments, the N-well NW1 further comprises another body contact configured to provide an electrical connection between the N-well NW1 and a PID protection circuit, e.g., as described with respect to FIG. 1B. In some embodiments, the body contact 135 is configured as a common electrical connection from the N-well NW1 to both a PID protection circuit and VDD. In some embodiments, VDD is provided from a VDD power rail (not shown) on the back side 112 of the substrate 110 to the N-well NW1 through, or without, a well tap on the front side 111. In the example configuration in FIG. 1A, the source/drain 134 of the transistor P1 is electrically coupled to the body contact 135. Other configurations are within the scopes of various embodiments. For example, the source/drain 134 is not electrically coupled to the body contact 135 in one or more embodiments.

The transistor N2 over the P-well PW2 is configured similarly to the transistor N1, and comprises source/drains 143, 144 and a body contact 145 corresponding to the source/drains 123, 124 and the body contact 125 of the transistor N1. In the example configuration in FIG. 1A, the body contact 145 is a P-doped region configured to electrically couple the P-well PW2 to VSS. In some embodiments, the P-well PW2 further comprises another body contact configured to provide an electrical connection between the P-well PW2 and a PID protection circuit, e.g., as described with respect to FIG. 1B. In some embodiments, the body contact 145 is configured as a common electrical connection from the P-well PW2 to both a PID protection circuit and VSS. In some embodiments, VSS is provided from a VSS power rail (not shown) on the back side 112 of the substrate 110 to the P-well PW2 through, or without, a well tap on the front side 111. In the example configuration in FIG. 1A, the source/drain 144 of the transistor N2 is electrically coupled to the body contact 145. Other configurations are within the scopes of various embodiments. For example, the source/drain 144 is not electrically coupled to the body contact 145 in one or more embodiments.

The transistor P2 over the N-well NW2 is configured similarly to the transistor P1, and comprises source/drains 153, 154 and a body contact 155 corresponding to the source/drains 133, 134 and the body contact 135 of the transistor P1. In the example configuration in FIG. 1A, the body contact 155 is an N-doped region configured to electrically couple the N-well NW2 to a PID protection circuit 172, as described herein. In some embodiments, the N-well NW2 further comprises another body contact configured to provide an electrical connection between the N-well NW2 and VDD. In some embodiments, the body contact 155 is configured as a common electrical connection from the N-well NW2 to both the PID protection circuit 172 and VDD. In some embodiments, VDD is provided from a VDD power rail (not shown) on the back side 112 of the substrate 110 to the N-well NW2 through, or without, a well tap on the front side 111. In some embodiments, the source/drain 154 is electrically coupled to the body contact 155.

The IC device 100A further comprises contact structures (not shown) over and in electrical contact with corresponding source/drains of the transistors N1, P1, N2, P2. Contact structures are sometimes referred to as metal-to-device (MD) contact structures. MD contact structures comprise a conductive material, e.g., a metal, formed over corresponding source/drains to define electrical connections among semiconductor devices of the IC device 100A, to form one or more functional circuits and/or PID protection circuits. In some embodiments, MD contact structures are formed over one or more of the body contacts 125, 135, 145, 155.

The IC device 100A further comprises vias (not shown) over and in electrical contact with the corresponding gates and MD contact structures. A via over and in electrical contact with an MD contact structure is sometimes referred to as via-to-device (VD) via. A via over and in electrical contact with a gate is sometimes referred to as via-to-gate (VG) via. An example material of VD and/or VG vias includes metal. Other configurations are within the scopes of various embodiments.

The IC device 100A further comprises a redistribution structure 160 which is over the VD, VG vias. The redistribution structure 160 comprises a plurality of metal layers and via layers sequentially and alternatingly arranged over the VD, VG vias. The redistribution structure 160 further comprises various interlayer dielectric (ILD) layers (not shown) in which the metal layers and via layers are embedded. The metal layers and via layers of the redistribution structure 160 are configured to electrically couple various elements or circuits of the IC device 100A with each other, and with external circuitry. In the redistribution structure 160, the lowermost metal layer immediately over and in electrical contact with the VD, VG vias is an M0 (metal-zero) layer, a next metal layer immediately over the M0 layer is an M1 layer, a next metal layer immediately over the M1 layer is an M2 layer, or the like. Conductive patterns in the M0 layer are referred to as M0 conductive patterns, conductive patterns in the M1 layer are referred to as M1 conductive patterns, or the like. A via layer Vm is arranged between and electrically couple the Mm layer and the Mm+1 layer, where m is an integer from zero and up. For example, a via-zero (V0) layer is the lowermost via layer which is arranged between and electrically couple the M0 layer and the M1 layer. Other via layers are V1, V2, or the like. Vias in the V0 layer are referred to as V0 vias, vias in the V1 layer are referred to as V1 vias, or the like. For simplicity, metal layers and via layers in the redistribution structure 160 are not fully illustrated in FIG. 1A.

In the example configuration in FIG. 1A, the redistribution structure 160 comprises a conductive structure 161 which comprises conductive patterns in various metal layers and corresponding vias in various via layers, and is electrically coupled to the source/drain 134 and body contact 135 over the N-well NW1. The redistribution structure 160 further comprises a conductive structure 162 which comprises conductive patterns in various metal layers (e.g., M0 to Mn where n is a positive integer) and corresponding vias in various via layers (e.g., V0 to Vn), and is electrically coupled to the source/drain 144 and body contact 145 over the P-well PW2. In some embodiments, the conductive structure 161 is configured to electrically couple a VDD power rail to the N-well NW1, and/or the conductive structure 162 is configured to electrically coupled a VSS power rail to the P-well PW2. In some embodiments, the IC device 100A comprises conductive structures similar to the conductive structures 161, 162, and electrically coupled to the P-well PW1 and/or N-well NW2.

The redistribution structure 160 further comprises an interconnect 163. In some embodiments, an interconnect is a set of one or more conductive patterns and one or more vias which together electrically couple circuit elements, such as semiconductor devices over the substrate 110. In the example configuration in FIG. 1A, the interconnect 163 comprises conductive patterns in various metal layers (e.g., M0 to Mk where k is a positive integer) and corresponding vias in various via layers, and electrically couples the source/drains 143, 153 to the gates 122, 132. The Mk layer is the highest metal layer that comprises a conductive pattern of the interconnect 163. The interconnect 163 is an example of a signal path from one or more semiconductor devices, e.g., the transistors N1, P1, to one or more further semiconductor devices, e.g., the transistors N2, P2. The interconnect 163 is also an example showing that an N-well (e.g., N-well NW2) or a P-well (e.g., P-well PW2) is electrically connectable to a gate (e.g., 122) over a further P-well (e.g., P-well PW1) and/or a gate (e.g., 132) over a further N-well (e.g., N-well NW1). In some embodiments, the interconnect 163 is electrically coupled to one, not both, of the source/drains 143, 153, and/or to one, not both, of the gates 122, 132. Other configurations are within the scopes of various embodiments.

During the manufacturing/fabricating process of the IC device 100A, especially during the manufacturing/fabricating process of the redistribution structure 160 upward from the M0 layer, positive and/or negative electric charges are potentially accumulated in one or more of the N-well NW1, P-well PW1, N-well NW2, P-well PW2. For example, as the conductive structure 161 is being manufactured, electric charges are potentially accumulated in the N-well NW1 due to the electrical connection between the N-well NW1 and the conductive structure 161 through the source/drain 134 and/or the body contact 135. For example, as the conductive structure 162 is being manufactured, electric charges are potentially accumulated in the P-well PW2 due to the electrical connection between the P-well PW2 and the conductive structure 162 through the source/drain 144 and/or the body contact 145. Similarly, electric charges are potentially accumulated in the P-well PW1 and/or N-well NW2. In some situations, negative charges are often accumulated in P-wells and/or positive charges are often accumulated in N-wells.

When the manufacturing of the interconnect 163 is completed, a potential of electric charges accumulated in the P-well PW2 and/or N-well NW2 is applied through the completed interconnect 163 to the gates 122, 132. There is a risk that such a potential and a potential of electric charges accumulated in the P-well PW1 or N-well NW1 together create a undesirably high voltage across the corresponding gate dielectric 121 or 131, causing undesirable PID to the gate dielectric 121 or 131. In some situations, negative charges accumulated in P-wells (e.g., P-well PW1 and P-well PW2) potentially cause damages to gate dielectrics of N-type semiconductor devices (e.g., transistor N1) and/or positive charges accumulated in N-wells (e.g., N-well NW1, N-well NW2) potentially cause damages to gate dielectrics of P-type semiconductor devices (e.g., transistor P1). One of the positive and negative electric charges are examples of electric charges of a first polarity, and the other of the positive and negative electric charges are examples of electric charges of a second polarity opposite to the first polarity. Semiconductor devices (e.g., the transistors N2, P2) that potentially cause PID to other semiconductor devices are sometimes referred to as PID aggressors. Semiconductor devices (e.g., the transistors N1, P1) that are potentially susceptible to PID cause by other semiconductor devices are sometimes referred to as PID victims.

In some embodiments, to prevent or at least mitigate PID issues, electric charges in one or more of the N-well NW1, P-well PW1, N-well NW2, P-well PW2 are discharged by one or more corresponding PID protection circuits before the manufacturing of the interconnect 163 is completed. In the example configuration in FIG. 1A, the IC device 100A comprises PID protection circuits 171, 172 correspondingly for the P-well PW1 and N-well NW2. In at least one embodiment, one or more of the N-well NW1, P-well PW2 also comprise one or more corresponding PID protection circuits, e.g., as described with respect to FIG. 1B.

The PID protection circuit 171 comprises PID protection devices 175, 176 electrically coupled in series between the substrate 110 and the P-well PW1. The PID protection devices 175, 176 are schematically illustrated in FIG. 1A, and are formed, in one or more embodiments, in or over the substrate 110. For example, the PID protection devices 175, 176 comprise one or more of N-doped regions, P-doped regions, body contacts (or taps), N-wells and/or P-wells which are configured and/or manufactured similarly to one or more of N-doped regions, P-doped regions, body contacts (or taps), N-wells and/or P-wells described with respect to the transistors N1, P1, N2, P2. Examples of PID protection devices include, but are not limited to, N-type diodes, P-type diodes, diode-connected MOS transistors, diode-connected BJTs, or any device having or configuring a P-N junction.

In a PID protection circuit, one of the PID protection devices is configured as a forward diode, whereas the other PID protection device is configured as a reverse diode. For example, in the PID protection circuit 171, the PID protection device 175 is configured as a forward diode whereas the PID protection device diode 176 is configured as a reverse diode, or vice versa. For simplicity, PID protection devices are sometimes referred to herein as a protection devices or diodes. The diode 175 has an anode 165 electrically coupled to the P-well PW1 through the body contact 125, and a cathode (not numbered) coupled to a cathode (not numbered) of the diode 176. The diode 176 has an anode 166 electrically coupled to the substrate 110, e.g., at a region 116 outside the doped region NBL-A and doped region NBL-B.

In some embodiments, the anode 165 of the diode 175 is electrically coupled to the body contact 125 through one or more MD contact structures, VD vias, and a first interconnect. In some embodiments, the anode 166 of the diode 176 is electrically coupled to a body contact or substrate tap on the front side 111 of the substrate 110, through one or more MD contact structures, VD vias, and a second interconnect. For simplicity, the second interconnect is not fully illustrated. An Mi layer is the highest metal layer that comprises a conductive pattern of the first interconnect or the second interconnect, where i is an integer smaller than k. For example, k=3 and i=0 in one or more embodiments. As a result, the PID protection circuit 171 is electrically coupled between the P-well PW1 and the substrate 110 when the Mi layer (e.g., the M0 layer where i=0) is formed and before the interconnect 163 is completed (e.g., before the M3 layer is formed, where k=3). In the example configuration in FIG. 1A, the highest Mi conductive pattern is in the first interconnect between the anode 165 and the body contact 125. In another example, the highest Mi conductive pattern is in the second interconnect (not shown) between the anode 166 and the substrate 110. In a further example, each of the first interconnect and the second interconnect comprises a corresponding Mi conductive pattern. In at least one embodiment, at least one of the first interconnect or the second interconnect is omitted. For example, in one or more embodiments, the region 116 of the substrate 110 forms a part of the diode 176, and the second interconnect is omitted.

The PID protection circuit 171 electrically coupled between the P-well PW1 and the substrate 110 is configured to discharge electric charges accumulated in the P-well PW1 to the substrate 110. For example, when a potential of the P-well PW1 is higher than a potential of the substrate 110 due to, e.g., positive electric charges accumulated in the P-well PW1, the diode 175 is turned ON. The positive electric charges accumulated in the P-well PW1 pass through the turned ON diode 175 and are then discharged, by a leakage current of the diode 176, to the substrate 110, as schematically illustrated by an arrow in FIG. 1A. For another example, when the potential of the P-well PW1 is lower than the potential of the substrate 110 due to, e.g., negative electric charges accumulated in the P-well PW1, the diode 176 is turned ON. The negative electric charges accumulated in the P-well PW1 are discharged, by a leakage current of the diode 175, and then pass through the turned ON diode 176 to the substrate 110.

The PID protection circuit 172 comprises PID protection devices 177, 178 electrically coupled in series between the substrate 110 and the N-well NW2. The PID protection devices 177, 178 are schematically illustrated in FIG. 1A, and are formed, in one or more embodiments, in or over the substrate 110. For example, the PID protection devices 177, 178 comprise one or more of N-doped regions, P-doped regions, body contacts (or taps), N-wells and/or P-wells which are configured and/or manufactured similarly to one or more of N-doped regions, P-doped regions, body contacts (or taps), N-wells and/or P-wells described with respect to the transistors N1, P1, N2, P2. Examples of PID protection devices include, but are not limited to, N-type diodes, P-type diodes, diode-connected MOS transistors, diode-connected BJTs, or any device having or configuring a P-N junction.

In the PID protection circuit 172, the PID protection device 177 is configured as a reverse diode whereas the PID protection device diode 178 is configured as a forward diode, or vice versa. For simplicity, the PID protection devices 177, 178 are sometimes referred to herein as a protection devices or diodes. The diode 177 has a cathode 167 electrically coupled to the N-well NW2 through the body contact 155, and an anode (not numbered) coupled to an anode (not numbered) of the diode 178. The diode 178 has a cathode 168 electrically coupled to the substrate 110, e.g., at a region 118 outside the doped region NBL-A and doped region NBL-B. In other words, in the PID protection circuit 172, the diodes 177, 178 have the corresponding anodes electrically coupled together, unlike the protection circuit 171 in which the diodes 175, 176 have the corresponding cathodes electrically coupled together. These are examples. In some embodiments, the diodes 177, 178 have the corresponding cathodes electrically coupled together, and/or the diodes 175, 176 have the corresponding anodes electrically coupled together.

In some embodiments, the cathode 167 of the diode 177 is electrically coupled to the body contact 155 through one or more MD contact structures, VD vias, and a third interconnect. In some embodiments, the cathode 168 of the diode 178 is electrically coupled to a body contact, or substrate tap, on the front side 111 of the substrate 110, through one or more MD contact structures, VD vias, and a fourth interconnect. For simplicity, the fourth interconnect is not fully illustrated. An Mj layer is the highest metal layer that comprises a conductive pattern of the third interconnect or the fourth interconnect, where j is an integer smaller than k. In some embodiments, j is the same as i. In at least one embodiment, j is different from i. For example, k=3 and j=0 in one or more embodiments. As a result, the PID protection circuit 172 is electrically coupled between the N-well NW2 and the substrate 110 when the Mj layer (e.g., the M0 layer where j=0) is formed and before the interconnect 163 is completed (e.g., before the M3 layer is formed, where k=3). In the example configuration in FIG. 1A, the highest Mj conductive pattern is in the third interconnect between the cathode 167 and the body contact 155. In another example, the highest Mj conductive pattern is in the fourth interconnect (not shown) between the cathode 168 and the substrate 110. In a further example, each of the third interconnect and the fourth interconnect comprises a corresponding Mj conductive pattern. In at least one embodiment, at least one of the third interconnect or the fourth interconnect is omitted. For example, in one or more embodiments, the region 118 of the substrate 110 forms a part of the diode 178, and the fourth interconnect is omitted.

The PID protection circuit 172 electrically coupled between the N-well NW2 and the substrate 110 is configured to discharge electric charges accumulated in the N-well NW2 to the substrate 110. For example, when a potential of the N-well NW2 is lower than a potential of the substrate 110 due to, e.g., negative electric charges accumulated in the N-well NW2, the diode 177 is turned ON. The negative electric charges accumulated in the N-well NW2 pass through the turned ON diode 177 and are then discharged, by a leakage current of the diode 178, to the substrate 110. For another example, when the potential of the N-well NW2 is higher than the potential of the substrate 110 due to, e.g., positive electric charges accumulated in the N-well NW2, the diode 178 is turned ON. The positive electric charges accumulated in the N-well NW2 are discharged, by a leakage current of the diode 177, and then pass through the turned ON diode 178 to the substrate 110.

The described configurations where cathodes of two serially coupled diodes are electrically coupled together (e.g., in the PID protection circuit 171) or where anodes of two serially coupled diodes are electrically coupled together (e.g., in the PID protection circuit 172) are examples of a configuration sometimes referred to herein as a dual reversed junction configuration.

In some embodiments, the IC device 100A further comprises a PID protection circuit similar to the protection circuit 171 and electrically coupled between the P-well PW2 and the substrate 110, and/or a PID protection circuit similar to the protection circuit 172 and electrically coupled between the N-well NW1 and the substrate 110. In at least one embodiment, positive and/or negative electric charges accumulated in the N-well NW1 and/or the P-well PW2 are discharged by the corresponding PID protection circuit(s) to the substrate 110 in manners similar to those described with respect to the protection circuit 171 and/or the protection circuit 172.

In some embodiments, during the manufacturing process of the IC device 100A, the electrical connections, or interconnects, of the PID protection circuits to the substrate 110 and the corresponding doped wells are completed at one or more metal layers lower than the Mk layer, i.e., before the interconnect 163 is completed. As a result, in one or more embodiments, electric charges accumulated in one or more of the N-well NW1, P-well PW1, N-well NW2, P-well PW2 are discharged by the corresponding one or more PID protection circuits to the substrate 110 before the interconnect 163 is completed, thereby preventing a undesirably high voltage from being applied across one or more of the gate dielectrics 121, 131 and avoiding, or at least mitigating, PID issues.

In some embodiments, during operation of the IC device 100A, a working voltage is applied across one or more of the PID protection circuits. For example, when the N-well NW2 is electrically coupled to, or biased by, VDD, and the substrate 110 is electrically coupled to, or biased by, VSS, a working voltage of VDD-VSS is applied between the N-well NW2 and the substrate 110, i.e., across the protection circuit 172. In some situations, such a working voltage is a high DC voltage, e.g., 36 V. Other working voltage values are within the scopes of various embodiments. In some embodiments, the presence of multiple PID protection devices 177, 178 in the protection circuit 172 make it possible for the protection circuit 172 to sustain a high working voltage, without causing damages and/or reliability issues to the IC device 100A. This is an improvement over other approaches where a single diode for discharging electric charges accumulated in a doped well may not be sufficient to sustain a high working voltage, e.g., 36 V, in operation.

In at least one embodiment, the PID protection circuits do not affect functionality and/or operation of various functional circuits in the IC device 100A. In some embodiments, it is possible to achieve one or more further advantages including, but not limited to, low chip area impact, no ESD concerns, or the like. PID protection circuits in accordance with some embodiments are applicable to various designs with different voltage applications, and/or suitable for every technology node (or process node). PID protection circuits in accordance with some embodiments make it possible to satisfy all DC, ESD and PID requirements.

Figure 1B:
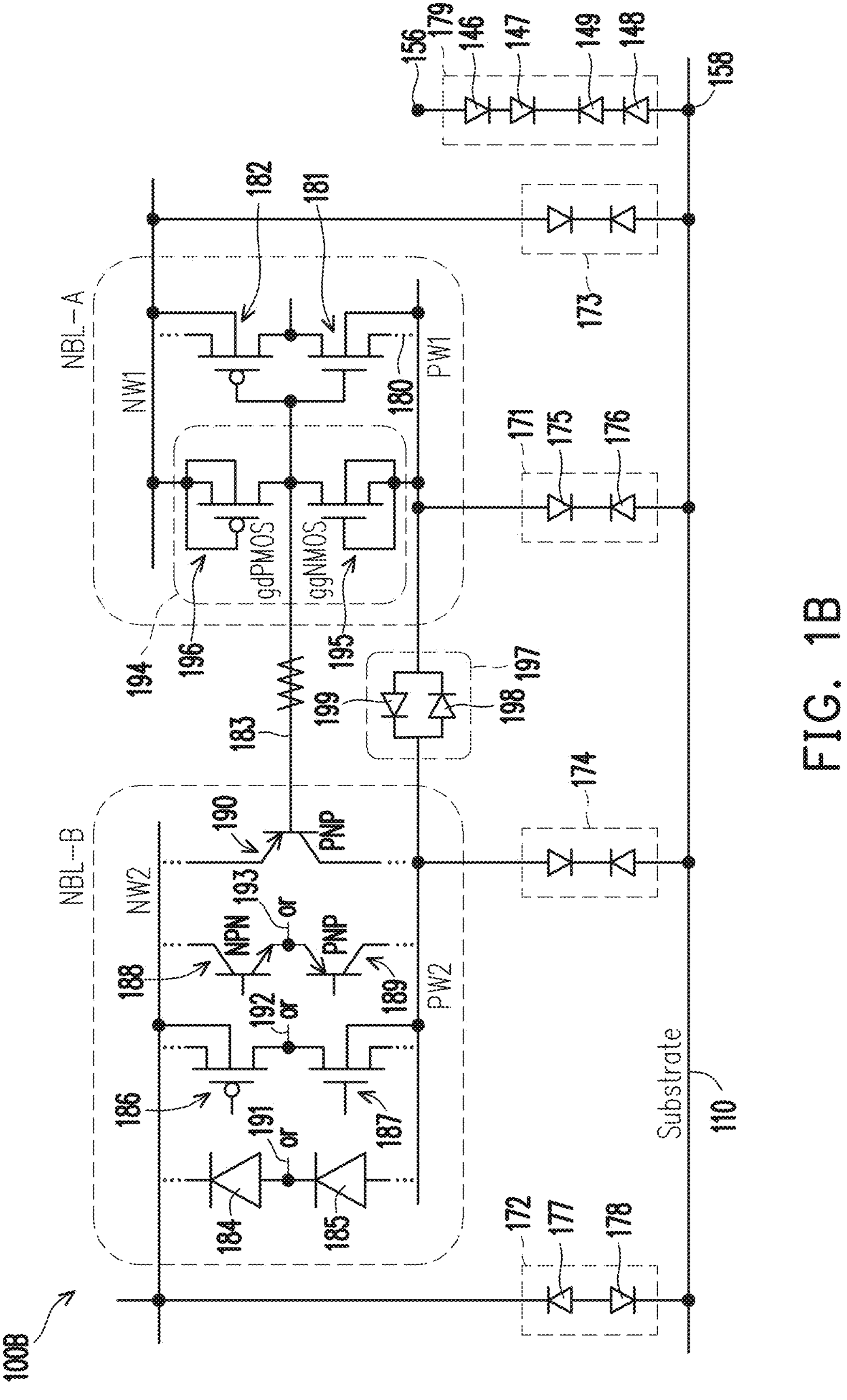
FIG. 1B is a schematic circuit diagram of an IC device, in accordance with some embodiments.

FIG. 1B is a schematic circuit diagram of an IC device 100B, in accordance with some embodiments. In some embodiments, the IC device 100B corresponds to the IC device 100A. For simplicity, corresponding components of the IC devices 100A, 100B are designated by the same reference numerals.

The IC device 100B comprises a doped region NBL-A and a doped region NBL-B. The doped region NBL-A comprises therein an N-well NW1 and a P-well PW1. The doped region NBL-B comprises therein an N-well NW2 and a P-well PW2.

The IC device 100B further comprises one or more semiconductor devices, which configure potential PID victims, formed over the doped region NBL-A. In the example configuration in FIG. 1B, potential PID victims comprise an NMOS transistor 181 over the P-well PW1, and/or a PMOS transistor 182 over the N-well NW1. In some embodiments, the NMOS transistor 181 corresponds to the transistor N1 and/or the PMOS transistor 182 corresponds to the transistor P1. Gates (not numbered) of the NMOS transistor 181 and PMOS transistor 182 are electrically coupled together, and to an electrical connection 183. In some embodiments, the electrical connection 183 is a signal path and/or corresponds to the interconnect 163. In some embodiments, the electrical connection 183 is electrically coupled to one, not both, of the gates of the NMOS transistor 181 and PMOS transistor 182. In FIG. 1B, electrical connections which are present in some designs or circuits, but are absent in other designs or circuits, are schematically illustrated by dot-dot (broken) lines. For example, a source/drain 180 of the NMOS transistor 181 is electrically coupled to the P-well PW1 in one or more embodiments, or is not electrically coupled to the P-well PW1 in one or more further embodiments.

The IC device 100B further comprises one or more semiconductor devices, which configure potential PID aggressors, formed over the doped region NBL-B. In the example configuration in FIG. 1B, potential PID aggressors comprise one or more of diodes 184, 185, and/or one or more of MOS devices such as a PMOS transistor 186 and an NMOS transistor 187, and/or one or more of BJTs such as an NPN BJT 188 and PNP BJTs 189 190. In some embodiments, a PID aggressor comprises any P-N junction electrically coupled to a gate of a PID victim. In the example configuration in FIG. 1B, the electrical connection 183 is electrically coupled to a base of the PNP BJT 190. In further examples, the electrical connection 183 is electrically coupled to one or more of a junction 191 between the diodes 184, 185, a junction 192 between the PMOS transistor 186 and NMOS transistor 187, and/or a junction 193 between the NPN BJT 188 and the PNP BJT 189. In some embodiments, the PMOS transistor 186 corresponds to the transistor P2, and/or the NMOS transistor 187 corresponds to the transistor N2.

The IC device 100B further comprises PID protection circuits 171-174 electrically coupled between the substrate 110 and the corresponding P-well PW1, N-well NW2, N-well NW1, P-well PW2. Each of the PID protection circuits 171-174 comprises a pair of PID protection devices correspondingly configured as a forward diode and a reverse diode, e.g., as described with respect to FIG. 1A. In the example configuration in FIG. 1B, the forward and reverse diodes (not numbered) of the PID protection circuits 173, 174 have corresponding cathodes electrically coupled together, similarly to the diodes 175, 176 of the PID protection circuit 171. In some embodiments, in at least one of the PID protection circuits 173, 174, the forward and reverse diodes have corresponding anodes electrically coupled together, similarly to the diodes 177, 178 of the PID protection circuit 172. Other configurations are within the scopes of various embodiments. In at least one embodiment, one or more of the PID protection circuits 171-174 is/are omitted.

In the example configuration in FIG. 1B, each of the PID protection circuits 171-174 is illustrated as comprising a pair of diodes. This is an example. In some embodiments, a PID protection circuit comprises more than one forward diode and/or more than one reverse diode. For example, a PID protection circuit 179 comprises a pair of forward diodes, e.g., 146, 147, and a pair of reverse diodes 148, 149 electrically coupled in series between the substrate 110 and a doped well. The PID protection circuit 179 is electrically coupled, at a first end corresponding to an anode 156 of the diode 146, to a doped well. For example, the anode 156 is electrically coupled to a body contact in the doped well in a manner similar to that described with respect to the body contact 125 or body contact 155 in FIG. 1A. The PID protection circuit 179 is electrically coupled, at a second end corresponding to an anode 158 of the diode 148, to the substrate 110. For example, the anode 158 is electrically coupled to the substrate 110 in a manner similar to that described with respect to the anode 166 in FIG. 1A. In the example configuration in FIG. 1B, the diodes 146-149 are coupled in a manner similar to the diodes 175, 176 in the PID protection circuit 171. Specifically, a cathode of the diode 146 is electrically coupled to an anode of the diode 147, cathodes of the diodes 147, 149 are electrically coupled together, and an anode of the diode 149 is electrically coupled to a cathode of the diode 148. In some embodiments, the cathodes and anodes of the diodes 146-149 switch place, resulting in a configuration similar to that described with respect to the PID protection circuit 172. In some embodiments, the PID protection circuit 179, or a PID protection circuit having multiple forward diodes and/or multiple reverse diodes, replaces one or more of the PID protection circuits 171-174. In some embodiments, a number of forward diodes in a PID protection circuit is different from a number of reverse diodes in the same PID protection circuit.

In at least one embodiment, the PID protection circuit 179, or a PID protection circuit having multiple forward diodes and/or multiple reverse diodes, is configured to operate similarly to the PID protection circuits 171-174, i.e., to discharge electric charges accumulated in the corresponding doped well to the substrate before the electrical connection 183 or a corresponding signal path is formed during the manufacture of the IC device 100B. Compared to the PID protection circuits 171-174, the increased number of diodes in the PID protection circuit 179 improvers the ability of the PID protection circuit 179 to sustain a high working voltage in operation, with a corresponding increased resistance in the leakage current path for discharging electric charges from the doped well during manufacture. In at least one embodiment, the number and/or configuration of diodes in a PID protection circuit are design considerations and are selected to ensure that the PID protection circuit provides the intended PID protection against the antenna effect during manufacture, while remaining sufficiently robust under the intended working voltage in operation.

The IC device 100B further comprises a local PID protection circuit 194 formed in the doped region NBL-A. The local PID protection circuit 194 comprises an NMOS transistor 195 and a PMOS transistor 196. In at least one embodiment, the NMOS transistor 195 is formed over the P-well PW1 and/or the PMOS transistor 196 is formed over the N-well NW1. The NMOS transistor 195 is electrically connected in a configuration sometimes referred to as a grounded-gate NMOS (ggNMOS) in which a gate, a first source/drain and a bulk of the NMOS transistor 195 are electrically coupled together and to the P-well PW1. The PMOS transistor 196 is electrically connected in a configuration sometimes referred to as a gate-VDD PMOS (gdPMOS) in which a gate, a first source/drain and a bulk of the PMOS transistor 196 are electrically coupled together and to the N-well NW1. A second source/drain of the NMOS transistor 195 and a second source/drain of the PMOS transistor 196 are electrically coupled together, to the electrical connection 183 and to the gates of the NMOS transistor 181 and PMOS transistor 182 which are potential PID victims.

During manufacture of the IC device 100B, the NMOS transistor 195 and PMOS transistor 196 are electrically coupled to the gates of the potential PID victims before the electrical connection 183 is completed, and the NMOS transistor 195 and/or PMOS transistor 196 is/are configured to discharge electric charges on the electrical connection 183, when completed, to protect the gate dielectrics of the potential PID victims from PID issues. In operation of the IC device 100B, the NMOS transistor 195 and PMOS transistor 196 are turned OFF and do not affect the functionality or operation of one or more functional circuits comprising the potential PID victims to be protected. In some embodiments, one of the NMOS transistor 195 and PMOS transistor 196 is omitted. In at least one embodiment, the local PID protection circuit 194 is omitted.

The IC device 100B further comprises a cross-well PID protection circuit 197. The cross-well PID protection circuit 197 comprises a diode 198 and a diode 199 formed over the substrate 110. The diode 198 has an anode electrically coupled to the P-well PW1, and a cathode electrically coupled to the P-well PW2. The diode 199 has an anode electrically coupled to the P-well PW2, and a cathode electrically coupled to the P-well PW1. In some embodiments, the diodes 198, 199 are electrically coupled to the P-wells PW1, PW2 at corresponding body contacts, as described with respect to FIG. 1A.

During manufacture of the IC device 100B, the diodes 198, 199 are formed and electrically coupled to the P-wells PW1, PW2 before the electrical connection 183 is completed, and at least one of the diodes 198, 199 is configured to pass electric charges between the P-wells PW1, PW2. As a result, a high voltage due to a potential difference between the P-wells PW1, PW2 is less likely to be applied across gate dielectrics of potential PID victims over the doped region NBL-A. The diodes 198, 199 do not affect the functionality or operation of one or more functional circuits comprising the potential PID victims to be protected. In some embodiments, one of the diodes 198, 199 is omitted. In at least one embodiment, the cross-well PID protection circuit 197 is omitted. In at least one embodiment, one or more advantages described herein are achievable by the IC device 100B.

Figure 2:
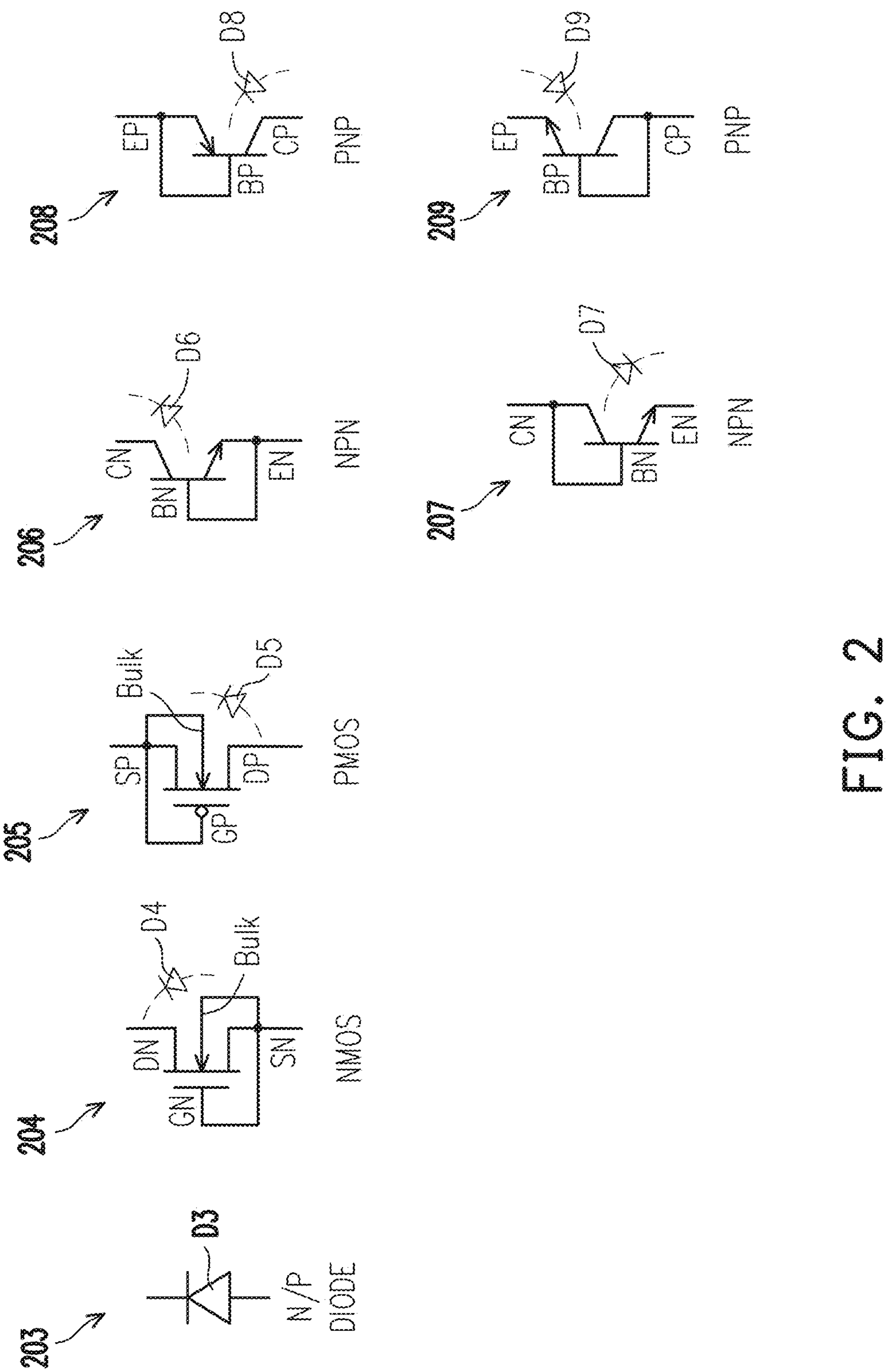
FIG. 2 includes schematic circuit diagrams of various protection devices, in accordance with some embodiments.

FIG. 2 includes schematic circuit diagrams of various PID protection devices 203-209, in accordance with some embodiments. In some embodiments, any of the PID protection devices 203-209 corresponds to any PID protection device in any of PID protection circuits described herein, such as the PID protection circuits 171-174, 179.

The PID protection device 203 comprises a diode D3. In some embodiments, the diode D3 is an N-type diode, i.e., a diode formed over, or in, a P-well or a P-doped region. In some embodiments, the diode D3 is a P-type diode, i.e., a diode formed over, or in, an N-well or an N-doped region. An N-type diode is schematically indicated in the drawings by a label "N" or "N diode." A P-type diode is schematically indicated in the drawings by a label "P" or "P diode." A diode that may be either an N-type diode or a P-type diode is schematically indicated in the drawings by a label "N/P" or "N/P diode." Examples of N-type and P-type diodes are described with respect to FIGS. 3A-3E.

The PID protection device 204 comprises a diode-connected NMOS transistor, and is sometimes referred to herein as diode-connected NMOS 204. The diode-connected NMOS 204 has a gate GN, a source SN, and a drain DN. The gate GN is electrically coupled to the source SN and to a bulk of the diode-connected NMOS 204. As a result, the diode-connected NMOS 204 configures a diode D4 having an anode corresponding to the gate GN/source SN/bulk, and a cathode corresponding to the drain DN. An example of a diode-connected NMOS transistor is described with respect to FIG. 4A.

The PID protection device 205 comprises a diode-connected PMOS transistor, and is sometimes referred to herein as diode-connected PMOS 205. The diode-connected PMOS 205 has a gate GP, a source SP, and a drain DP. The gate GP is electrically coupled to the source SP and to a bulk of the diode-connected PMOS 205. As a result, the diode-connected PMOS 205 configures a diode D5 having a cathode corresponding to the gate GP/source SP/bulk, and an anode corresponding to the drain DP. An example of a diode-connected PMOS transistor is described with respect to FIG. 4B.

The PID protection device 206 comprises a diode-connected NPN BJT, and is sometimes referred to herein as diode-connected NPN BJT 206. The diode-connected NPN BJT 206 comprises a base BN, a collector CN, and an emitter EN. The base BN is electrically coupled to the emitter EN. As a result, the diode-connected NPN BJT 206 configures a diode D6 having an anode corresponding to the base BN/emitter EN, and a cathode corresponding to the collector CN.

The PID protection device 207 comprises a diode-connected NPN BJT, and is sometimes referred to herein as diode-connected NPN BJT 207. Like the diode-connected NPN BJT 206, the diode-connected NPN BJT 207 comprises a base BN, a collector CN, and an emitter EN. The diode-connected NPN BJT 207 comprises a different electrical connection compared to the diode-connected NPN BJT 206. Specifically, in the diode-connected NPN BJT 207, the base BN is electrically coupled to the collector CN. As a result, the diode-connected NPN BJT 207 configures a diode D7 having an anode corresponding to the base BN/collector CN, and a cathode corresponding to the emitter EN. Examples of diode-connected NPN BJTs are described with respect to FIGS. 5A-5B.

The PID protection device 208 comprises a diode-connected PNP BJT, and is sometimes referred to herein as diode-connected PNP BJT 208. The diode-connected PNP BJT 208 comprises a base BP, a collector CP, and an emitter EP. The base BP is electrically coupled to the emitter EP. As a result, the diode-connected PNP BJT 208 configures a diode D8 having a cathode corresponding to the base BP/emitter EP, and an anode corresponding to the collector CP.

The PID protection device 209 comprises a diode-connected PNP BJT, and is sometimes referred to herein as diode-connected PNP BJT 209. Like the diode-connected PNP BJT 208, the diode-connected PNP BJT 209 comprises a base BP, a collector CP, and an emitter EP. The diode-connected PNP BJT 209 comprises a different electrical connection compared to the diode-connected PNP BJT 208. Specifically, in the diode-connected PNP BJT 209, the base BP is electrically coupled to the collector CP. As a result, the diode-connected PNP BJT 209 configures a diode D9 having a cathode corresponding to the base BP/collector CP, and an anode corresponding to the emitter EP. Examples of diode-connected PNP BJTs are described with respect to FIGS. 6A-6B.

The described N-type diode, diode-connected NMOS, and diode-connected NPN BJT are examples of N-type PID protection devices. The described P-type diode, diode-connected PMOS, and diode-connected PNP BJT are examples of P-type PID protection devices. In at least one embodiment, one or more advantages described herein are achievable by PID protection circuits comprising any one or more of the PID protection devices 203-209, and/or in IC devices comprising such PID protection circuits.

Figure 3B:
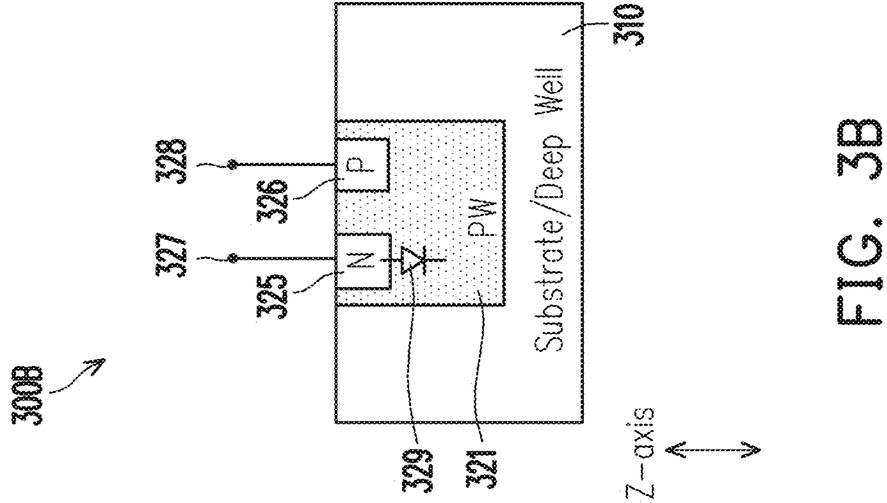
FIGS. 3A-3E, 4A-4B, 5A-5B, 6A-6B are schematic cross-sectional views of various protection devices, in accordance with some embodiments.
Figure 3A:
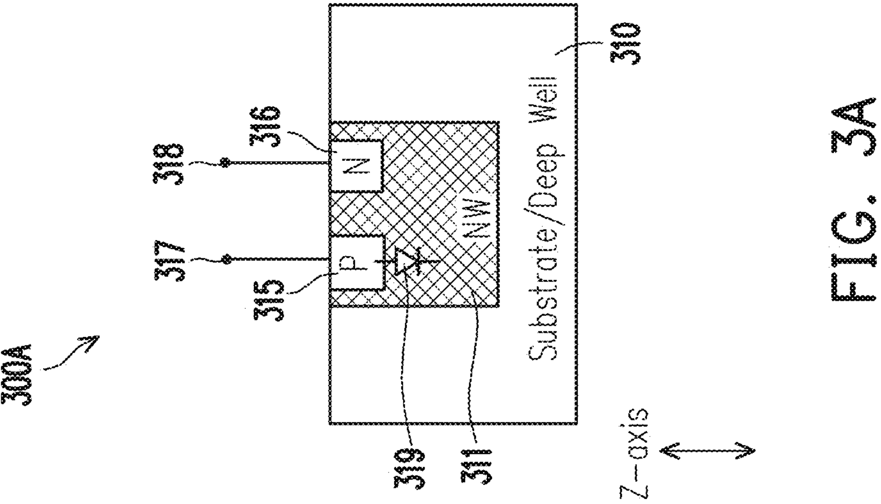

FIG. 3A is a schematic cross-sectional view of a PID protection device 300A, in accordance with some embodiments. In some embodiments, the PID protection device 300A corresponds to any PID protection device in any of PID protection circuits described herein, such as the PID protection circuits 171-174, 179. The PID protection device 300A is a P-type diode which corresponds to the PID protection device 203 in one or more embodiments. The PID protection device 300A is referred to herein as P-type diode 300A.

The P-type diode 300A is formed over a substrate 310. In some embodiments, the substrate 310 corresponds to the substrate 110. In at least one embodiment, the P-type diode 300A is formed over a doped region, e.g., a deep well as described with respect to FIG. 1A. The P-type diode 300A comprises an N-well 311, a P-doped region 315, an N-doped region 316, and conductive structures 317, 318.

In some embodiments, the N-well 311 corresponds to, or is similar to, the N-well NW1 or N-well NW2 described with respect to FIG. 1A. In some embodiments, the P-doped region 315 and N-doped region 316 correspond to, or are similar to, P-doped regions and N-doped regions described with respect to FIG. 1A. In some embodiments, the P-type diode 300A further comprises one or more STI regions (not shown).

A P-N junction between the P-doped region 315 and the N-well 311 configures a diode 319. The P-doped region 315 corresponds to an anode of the diode 319, and the N-well 311 corresponds to a cathode of the diode 319. In some embodiments, the diode 319 corresponds to the diode D3 being a P-type diode.

The conductive structure 317 is electrically coupled to the P-doped region 315 to provide an electrical connection to the anode of the diode 319. The conductive structure 318 is electrically coupled to the N-doped region 316 to provide an electrical connection to the cathode of the diode 319. In some embodiments, each or at least one of the conductive structures 317, 318 comprises one or more of an MD contact structure, a VD via, a conductive pattern and a via, all of which are below the Mk layer. In some embodiments, each of the conductive structures 317, 318 is configured to be electrically coupled to an anode or a cathode of another PID protection device, a doped well, or the substrate 310.

FIG. 3B is a schematic cross-sectional view of a PID protection device 300B, in accordance with some embodiments. In some embodiments, the PID protection device 300B corresponds to any PID protection device in any of PID protection circuits described herein, such as the PID protection circuits 171-174, 179. The PID protection device 300B is an N-type diode which corresponds to the PID protection device 203 in one or more embodiments. The PID protection device 300B is referred to herein as N-type diode 300B.

The N-type diode 300B is formed over the substrate 310. In at least one embodiment, the N-type diode 300B is formed over a doped region, e.g., a deep well as described with respect to FIG. 1A. The N-type diode 300B comprises a P-well 321, an N-doped region 325, a P-doped region 326, and conductive structures 327, 328. In some embodiments, the P-well 321 is omitted, and the substrate 310 is a P-type substrate which is configured as an anode of the N-type diode 300B.

In some embodiments, the P-well 321 corresponds to, or is similar to, the P-well PW1 or P-well PW2 described with respect to FIG. 1A. In some embodiments, the N-doped region 325 and P-doped region 326 correspond to, or are similar to, N-doped regions and P-doped regions described with respect to FIG. 1A. In some embodiments, the N-type diode 300B further comprises one or more STI regions (not shown).

A P-N junction between the N-doped region 325 and the P-well 321 (or the P-type substrate where the P-well 321 is omitted) configures a diode 329. The N-doped region 325 corresponds to a cathode of the diode 329, and the P-well 321 (or the P-type substrate where the P-well 321 is omitted) corresponds to an anode of the diode 329. In some embodiments, the diode 329 corresponds to the diode D3.

The conductive structure 327 is electrically coupled to the N-doped region 325 to provide an electrical connection to the cathode of the diode 329. The conductive structure 328 is electrically coupled to the P-doped region 326 to provide an electrical connection to the anode of the diode 329. In some embodiments, each or at least one of the conductive structures 327, 328 comprises one or more of an MD contact structure, a VD via, a conductive pattern and a via, all of which are below the Mk layer. In some embodiments, each of the conductive structures 327, 328 is configured to be electrically coupled to an anode or a cathode of another PID protection device, a doped well, or the substrate 310.

Figure 3D:
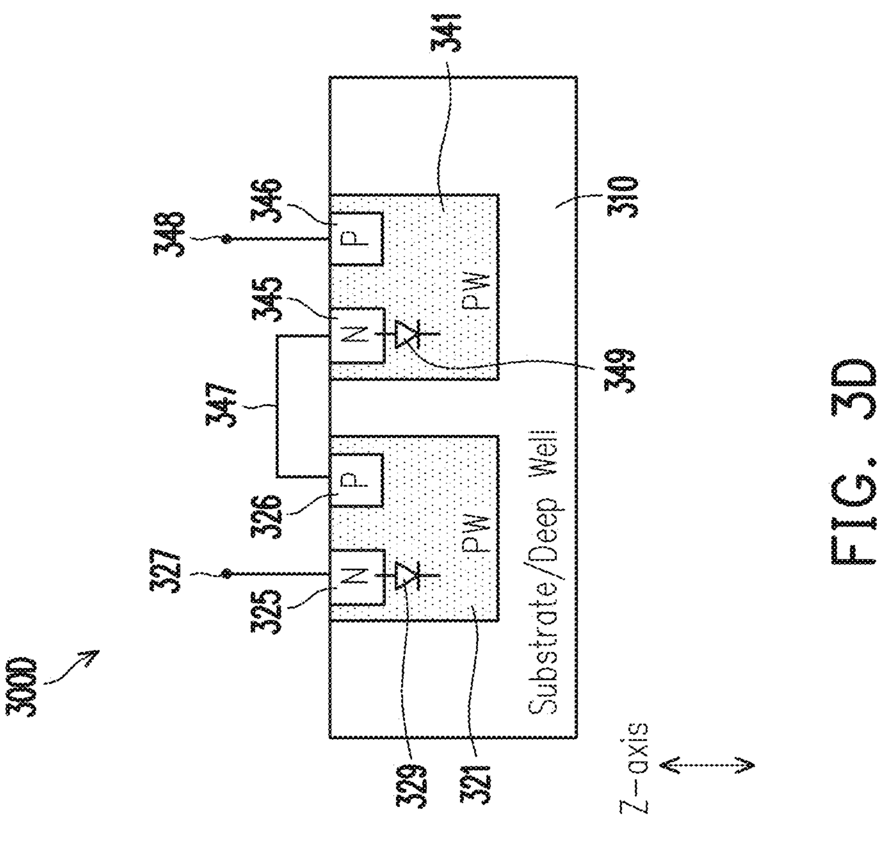
Figure 3C:
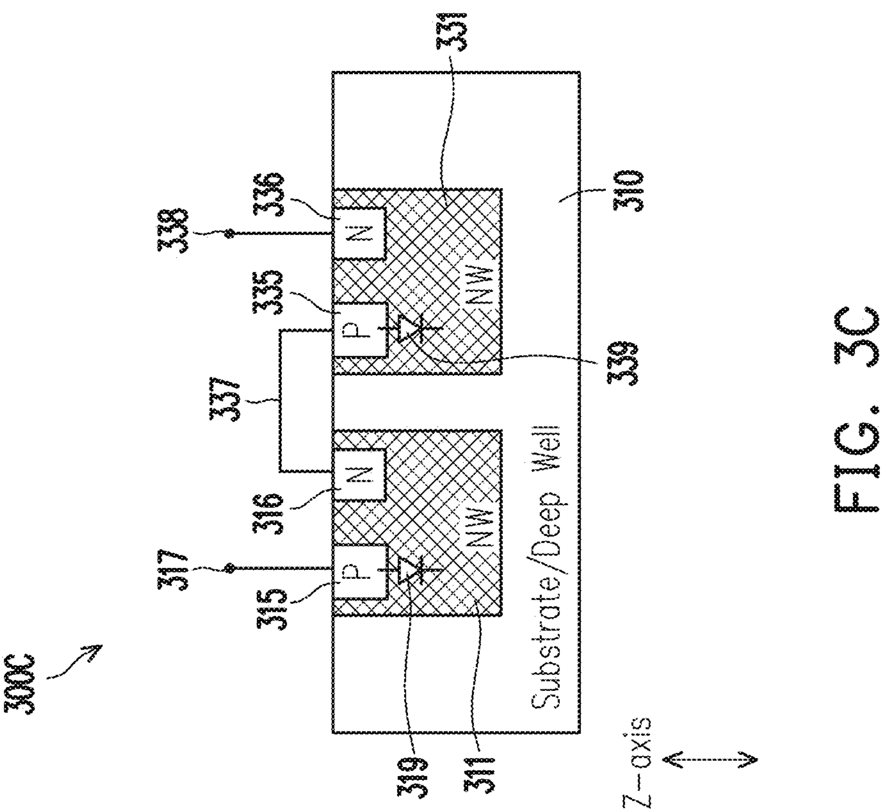

FIG. 3C is a schematic cross-sectional view of a PID protection device 300C, in accordance with some embodiments. The PID protection device 300C comprises two P-type diodes electrically coupled in series in a manner similar to the diodes 146, 147 or the diodes 148, 149 described with respect to FIG. 1B. For simplicity, components of the PID protection device 300C having corresponding components in the P-type diode 300A are designated by the same reference numerals, or by the reference numerals of the P-type diode 300A increased by twenty.

A first P-type diode of the PID protection device 300C corresponds to the P-type diode 300A, and comprises the N-well 311, the P-doped region 315, the N-doped region 316, the conductive structure 317, and the diode 319. A second P-type diode of the PID protection device 300C is similar to the P-type diode 300A, and comprises an N-well 331, a P-doped region 335, an N-doped region 336, a conductive structure 338, and a diode 339. The PID protection device 300C further comprises conductive structure 337 electrically coupling the N-doped region 316 and the P-doped region 335, i.e., electrically coupling the cathode of the diode 319 to an anode of the diode 339. In some embodiments, each or at least one of the conductive structures 337, 338 comprises one or more of an MD contact structure, a VD via, a conductive pattern and a via, all of which are below the Mk layer. In some embodiments, each of the conductive structures 317, 338 is configured to be electrically coupled to an anode or a cathode of another PID protection device, a doped well, or the substrate 310.

FIG. 3D is a schematic cross-sectional view of a PID protection device 300D, in accordance with some embodiments. The PID protection device 300D comprises two N-type diodes electrically coupled in series in a manner similar to the diodes 146, 147 or the diodes 148, 149 described with respect to FIG. 1B. For simplicity, components of the PID protection device 300D having corresponding components in the N-type diode 300B are designated by the same reference numerals, or by the reference numerals of the N-type diode 300B increased by twenty.

A first N-type diode of the PID protection device 300D corresponds to the N-type diode 300B, and comprises the P-well 321, the N-doped region 325, the P-doped region 326, the conductive structure 327, and the diode 329. A second N-type diode of the PID protection device 300D is similar to the N-type diode 300B, and comprises a P-well 341, an N-doped region 345, a P-doped region 346, a conductive structure 348, and a diode 349. The PID protection device 300D further comprises conductive structure 347 electrically coupling the P-doped region 326 and the N-doped region 345, i.e., electrically coupling the anode of the diode 329 to a cathode of the diode 349. In some embodiments, each or at least one of the conductive structures 347, 348 comprises one or more of an MD contact structure, a VD via, a conductive pattern and a via, all of which are below the Mk layer. In some embodiments, each of the conductive structures 327, 348 is configured to be electrically coupled to an anode or a cathode of another PID protection device, a doped well, or the substrate 310.

Figure 3E:
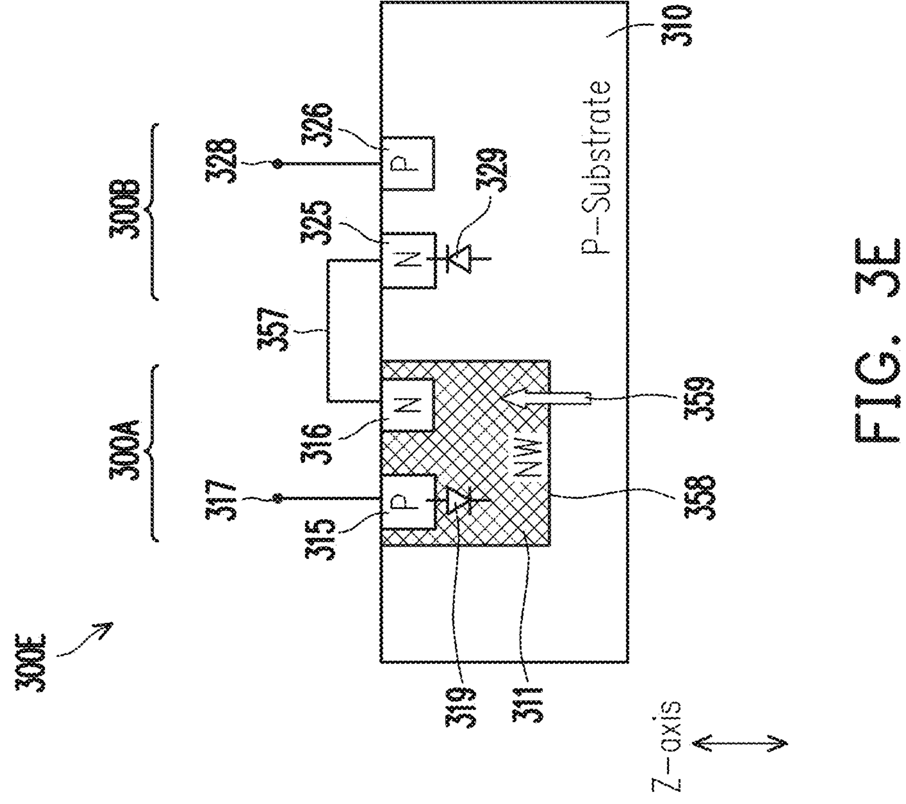

FIG. 3E is a schematic cross-sectional view of a PID protection circuit 300E, in accordance with some embodiments. In some embodiments, the PID protection circuit 300E corresponds to the PID protection circuit 703 described with respect to FIG. 7A.

The PID protection circuit 300E comprises the P-type diode 300A and N-type diode 300B electrically coupled in a dual reversed junction. In the example configuration in FIG. 3E, the P-well 321 of the N-type diode 300B is omitted. The N-doped region 316 of the P-type diode 300A is electrically coupled by a conductive structure 357 to the N-doped region 325 of the N-type diode 300B, thereby electrically coupling the cathodes of the diodes 319, 329 together. The conductive structure 317 is configured to be electrically coupled to a doped well from which electric charges are to be discharged, and the conductive structure 328 corresponds to a substrate tap for the substrate 310.

The PID protection circuit 300E is an example where an interconnect between a substrate and a PID protection circuit is omitted, because the substrate 310 is a P-type substrate which is configured as an anode of the N-type diode 300B. During a manufacturing process of an IC device comprising the PID protection circuit 300E, electric charges accumulated in a doped well (not shown) electrically coupled to the conductive structure 317 are discharged through the diode 319, conductive structure 357, and diode 329 to the substrate 310.

In operation of an IC device comprising the PID protection circuit 300E, the substrate 310 is biased with a working voltage applied to the conductive structure 328. A working voltage of the doped well is applied to the conductive structure 317. In situations where the working voltage of the substrate 310 is higher than the working voltage of the doped well (at the conductive structure 317), a P-N junction 358 between the substrate 310 and the N-well 311 will be forward-biased as schematically indicated by an arrow 359, and a undesired current is potentially induced. This is a reason, in one or more embodiments, to use the PID protection circuit 300E in a circuit design or application where a lower working voltage is applied to the substrate 310, and a higher working voltage is applied to the doped well from which electric charges are to be discharged during manufacture.

For similar reasons, in one or more embodiments, for IC devices, applications or circuit designs with different working voltages applied to a substrate and a doped well, a PID protection circuit to be electrically coupled between the substrate and the doped well is selected so that the PID protection circuit comprises an N-type PID protection device (i.e., a device with or over a P-type region such as a P-type substrate or a P-well) on the lower working voltage side, and a P-type PID protection device (i.e., a device with or over an N-type region such as an N-type substrate or an N-well) on the higher working voltage side. For example, in one or more embodiments, when the substrate has a lower working voltage than the doped well, an N-type PID protection device (e.g., an N-type diode, NMOS or NPN BJT) is electrically coupled to the substrate which has the lower working voltage, and a P-type PID protection device (e.g., a P-type diode, PMOS or PNP BJT) is electrically coupled to the doped well which has a higher working voltage. Various examples are described with respect to one or more of FIGS. 7A-7E.

Figure 4A:
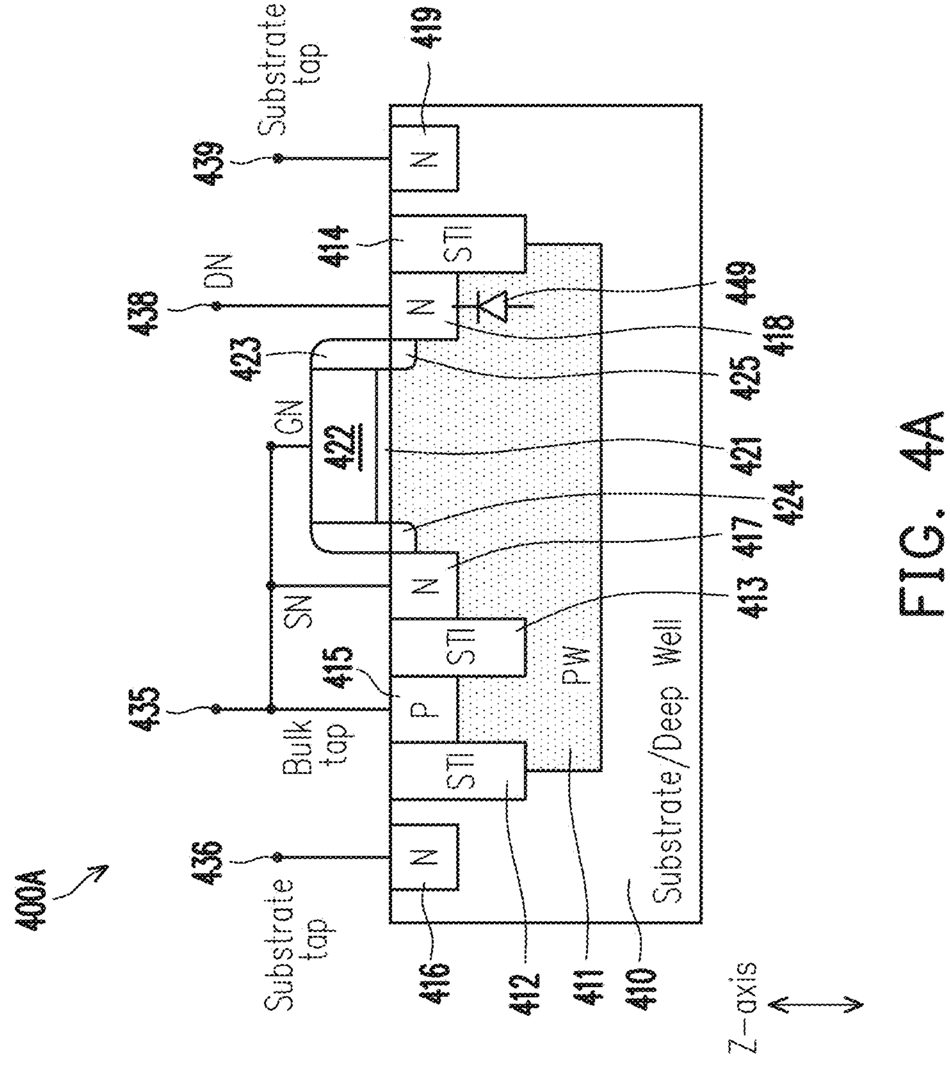

FIG. 4A is a schematic cross-sectional view of a PID protection device 400A, in accordance with some embodiments. In some embodiments, the PID protection device 400A corresponds to any PID protection device in any of PID protection circuits described herein, such as the PID protection circuits 171-174, 179. The PID protection device 400A is a diode-connected NMOS transistor which corresponds to the diode-connected NMOS 204 in one or more embodiments. The PID protection device 400A is referred to herein as diode-connected NMOS 400A.

The diode-connected NMOS 400A is formed over a substrate 410. In some embodiments, the substrate 410 corresponds to the substrate 110. In at least one embodiment, the diode-connected NMOS 400A is formed over a doped region, e.g., a deep well as described with respect to FIG. 1A. The diode-connected NMOS 400A comprises a P-well 411, STI regions 412, 413, 414 of a dielectric material, a P-doped region 415, N-doped regions 416-419, a gate dielectric 421, a gate 422, sidewalls 423, lightly doped regions 424, 425, and conductive structures 435, 436, 438, 439.

In some embodiments, the P-well 411 corresponds to, or is similar to, the P-well PW1 or P-well PW2 described with respect to FIG. 1A. The gate dielectric 421 and gate 422 are similar to the gate dielectric 121 and gate 122 described with respect to FIG. 1A. The gate 422 corresponds to the gate GN of the diode-connected NMOS 204. The P-doped region 415 and N-doped regions 416-419 correspond to, or are similar to, P-doped regions and N-doped regions described with respect to FIG. 1A. The N-doped regions 417, 418 correspond to the source SN and drain DN of the diode-connected NMOS 204. The P-doped region 415 is a body contact in the P-well 411, is similar to the body contact 125, 145, and is sometimes referred to as a bulk tap. The N-doped regions 416, 419 are body contacts in the substrate 410 or a DNW, and are sometimes referred to as substrate taps or well taps. The conductive structures 435, 436, 438, 439 are correspondingly over the P-doped region 415 and N-doped regions 416, 418, 419. In some embodiments, each or at least one of the conductive structures 435, 436, 438, 439 comprises one or more of an MD contact structure, a VD via, a VG via, a conductive pattern and a via, all of which are below the Mk layer.

The conductive structure 435 electrically couples the gate GN, source SN and bulk tap of the diode-connected NMOS 400A together. As a result, the diode-connected NMOS 400A configures a diode 449 at a P-N junction between the N-doped region 418 and the P-well 411. The N-doped region 418 corresponds to a cathode of the diode 449, and the P-well 411 corresponds to an anode of the diode 449. In some embodiments, the diode 449 corresponds to the diode D4.

The conductive structure 435 is electrically coupled to the P-doped region 415 to provide an electrical connection to the anode of the diode 449. The conductive structure 438 is electrically coupled to the N-doped region 418 to provide an electrical connection to the cathode of the diode 449. In some embodiments, each of the conductive structures 435, 438 is configured to be electrically coupled to an anode or a cathode of another PID protection device, a doped well, or the substrate 410. For example, when the conductive structure 436 or 439 is a substrate tap of the substrate 410, the substrate tap is electrically coupled to the conductive structure 435 or 438, e.g., by a conductive pattern in a metal layer below the Mk layer.

Figure 4B:
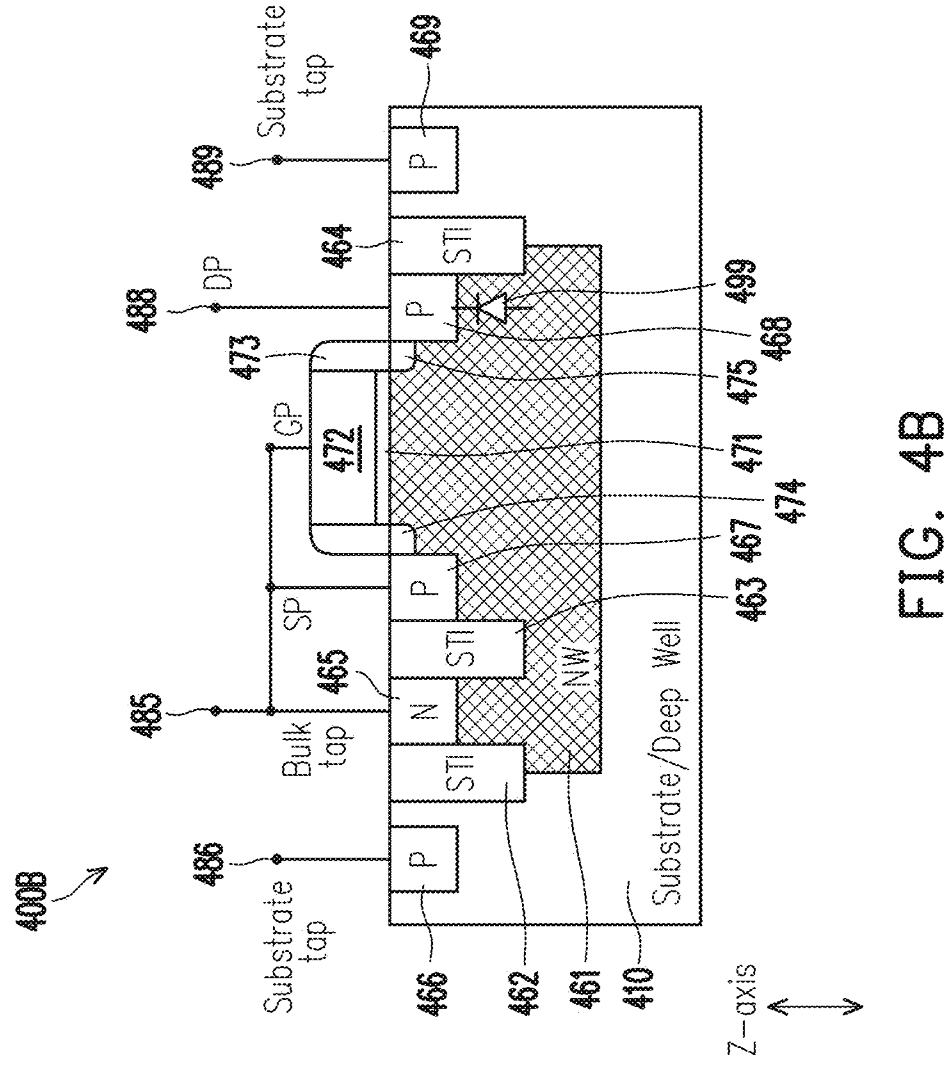

FIG. 4B is a schematic cross-sectional view of a PID protection device 400B, in accordance with some embodiments. In some embodiments, the PID protection device 400B corresponds to any PID protection device in any of PID protection circuits described herein, such as the PID protection circuits 171-174, 179. The PID protection device 400B is a diode-connected PMOS transistor which corresponds to the diode-connected PMOS 205 in one or more embodiments. The PID protection device 400B is referred to herein as diode-connected PMOS 400B.

The diode-connected PMOS 400B is formed over the substrate 410. In at least one embodiment, the diode-connected PMOS 400B is formed over a doped region, e.g., a deep well as described with respect to FIG. 1A. The diode-connected PMOS 400B comprises an N-well 461, STI regions 462, 463, 464 of a dielectric material, an N-doped region 465, P-doped regions 466-469, a gate dielectric 471, a gate 472, sidewalls 473, lightly doped regions 474, 475, and conductive structures 485, 486, 488, 489.

In some embodiments, the N-well 461 corresponds to, or is similar to, the N-well NW1 or N-well NW2 described with respect to FIG. 1A. The gate dielectric 471 and gate 472 are similar to the gate dielectric 121 and gate 122 described with respect to FIG. 1A. The gate 472 corresponds to the gate GP of the diode-connected PMOS 205. The N-doped region 465 and P-doped regions 466-469 correspond to, or are similar to, N-doped regions and P-doped regions described with respect to FIG. 1A. The P-doped regions 467, 468 correspond to the source SP and drain DP of the diode-connected PMOS 205. The N-doped region 465 is a body contact in the N-well 461, is similar to the body contact 135, 155, and is sometimes referred to as a bulk tap. The P-doped regions 466, 469 are body contacts in the substrate 410 or a DNW, and are sometimes referred to as substrate taps or well taps. The conductive structures 485, 486, 488, 489 are correspondingly over the N-doped region 465 and P-doped regions 466, 468, 469. In some embodiments, each or at least one of the conductive structures 485, 486, 488, 489 comprises one or more of an MD contact structure, a VD via, a VG via, a conductive pattern and a via, all of which are below the Mk layer.

The conductive structure 485 electrically couples the gate GP, source SP and bulk tap of the diode-connected PMOS 400B together. As a result, the diode-connected PMOS 400B configures a diode 499 at a P-N junction between the P-doped region 468 and the N-well 461. The P-doped region 468 corresponds to an anode of the diode 499, and the N-well 461 corresponds to a cathode of the diode 499. In some embodiments, the diode 499 corresponds to the diode D5.

The conductive structure 485 is electrically coupled to the N-doped region 465 to provide an electrical connection to the cathode of the diode 499. The conductive structure 488 is electrically coupled to the P-doped region 468 to provide an electrical connection to the anode of the diode 499. In some embodiments, each of the conductive structures 485, 488 is configured to be electrically coupled to an anode or a cathode of another PID protection device, a doped well, or the substrate 410. For example, when the conductive structure 486 or 489 is a substrate tap of the substrate 410, the substrate tap is electrically coupled to the conductive structure 485 or 488, e.g., by a conductive pattern in a metal layer below the Mk layer.

Figures 5A, 5B:
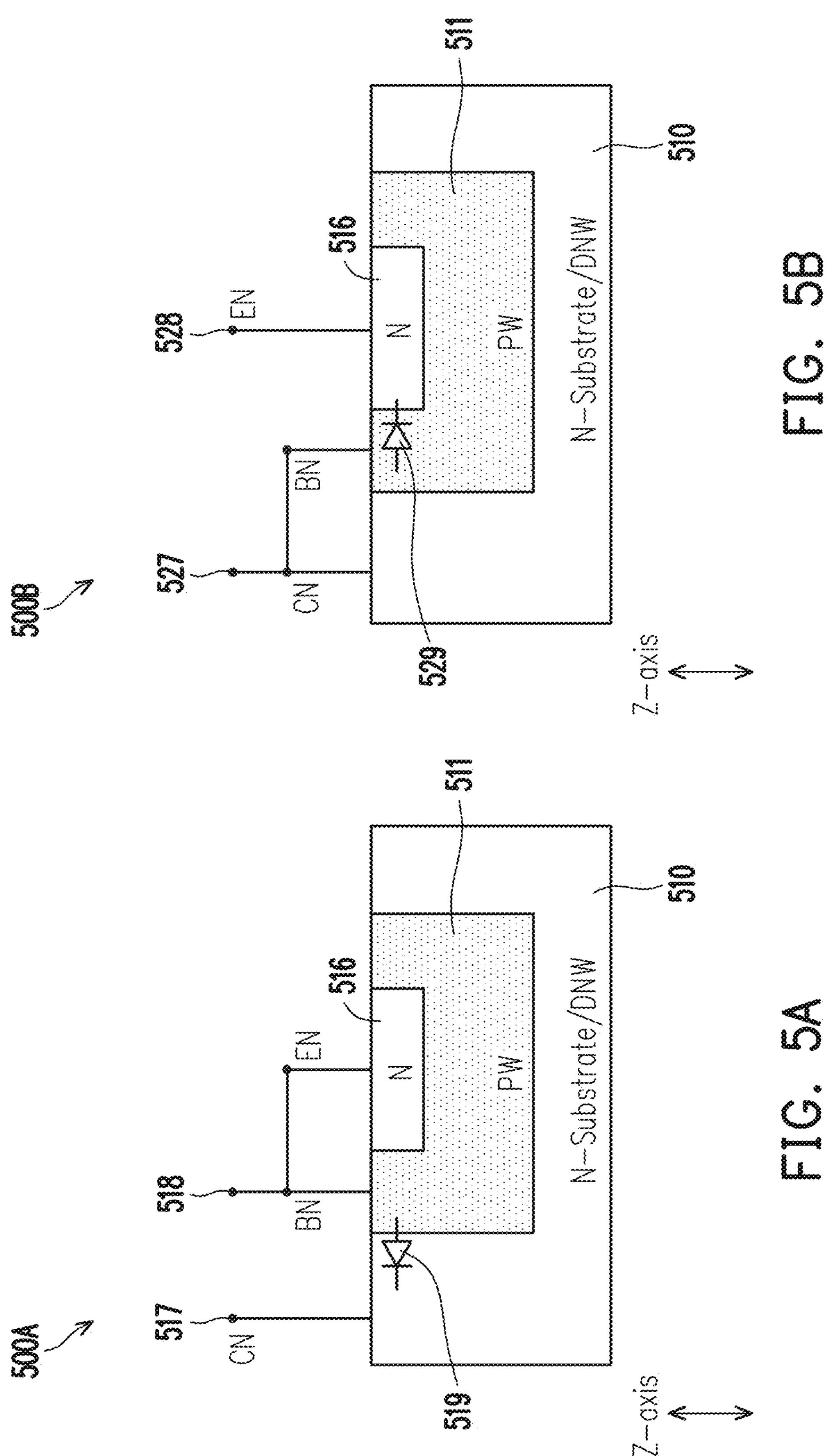

FIG. 5A is a schematic cross-sectional view of a PID protection device 500A, in accordance with some embodiments. In some embodiments, the PID protection device 500A corresponds to any PID protection device in any of PID protection circuits described herein, such as the PID protection circuits 171-174, 179. The PID protection device 500A is a diode-connected NPN BJT which corresponds to the diode-connected NPN BJT 206 in one or more embodiments. The PID protection device 500A is referred to herein as diode-connected NPN BJT 500A.

The diode-connected NPN BJT 500A is formed over a substrate 510. In some embodiments, the substrate 510 corresponds to the substrate 110. In at least one embodiment, the substrate 510 comprises a N-type substrate. In some embodiments, the diode-connected NPN BJT 500A is formed over an N-type doped region, e.g., a DNW as described with respect to FIG. 1A. The DNW or N-type substrate forms part of the diode-connected NPN BJT 500A. The diode-connected NPN BJT 500A further comprises a P-well 511, an N-doped region 516, and conductive structures 517, 518.

In some embodiments, the P-well 511 corresponds to, or is similar to, the P-well PW1 or P-well PW2 described with respect to FIG. 1A. The N-doped region 516 corresponds to, or is similar to, N-doped regions described with respect to FIG. 1A. In at least one embodiment, the diode-connected NPN BJT 500A further comprises one or more body contacts, e.g., a substrate tap and/or a well tap, for electrical connection of the conductive structure 517 to the DNW or substrate 510, and for electrical connection of the conductive structure 518 to the P-well 511. In some embodiments, each or at least one of the conductive structures 517, 518 comprises one or more of an MD contact structure, a VD via, a conductive pattern and a via, all of which are below the Mk layer.

The DNW or substrate 510 corresponds to the collector CN of the diode-connected NPN BJT 206. The P-well 511 corresponds to the base BN of the diode-connected NPN BJT 206. The N-doped region 516 corresponds to the emitter EN of the diode-connected NPN BJT 206. The conductive structure 518 electrically couples the base BN and emitter EN of the diode-connected NPN BJT 500A together. As a result, the diode-connected NPN BJT 500A configures a diode 519 at a P-N junction between the P-well 511 and the DNW or substrate 510. The DNW or substrate 510 corresponds to a cathode of the diode 519, and the P-well 511 corresponds to an anode of the diode 519. In some embodiments, the diode 519 corresponds to the diode D6. The conductive structure 517 provides an electrical connection to the cathode of the diode 519. The conductive structure 518 provides an electrical connection to the anode of the diode 519. In some embodiments, each of the conductive structures 517, 518 is configured to be electrically coupled to an anode or a cathode of another PID protection device, a doped well, or the substrate 510.

FIG. 5B is a schematic cross-sectional view of a PID protection device 500B, in accordance with some embodiments. In some embodiments, the PID protection device 500B corresponds to any PID protection device in any of PID protection circuits described herein, such as the PID protection circuits 171-174, 179. The PID protection device 500B is a diode-connected NPN BJT which corresponds to the diode-connected NPN BJT 207 in one or more embodiments. The PID protection device 500B is referred to herein as diode-connected NPN BJT 500B. For simplicity, components of the diode-connected NPN BJT 500B having corresponding components in the diode-connected NPN BJT 500A are designated by the same reference numerals, or by the reference numerals of the diode-connected NPN BJT 500A increased by ten.

The diode-connected NPN BJT 500B comprises a different electrical connection compared to the diode-connected NPN BJT 500A. Specifically, in the diode-connected NPN BJT 500B, a conductive structure 527 electrically couples the base BN and collector CN together. As a result, the diode-connected NPN BJT 500B configures a diode 529 at a P-N junction between the P-well 511 and the N-doped region 516. The N-doped region 516 corresponds to a cathode of the diode 529, and the P-well 511 corresponds to an anode of the diode 529. In some embodiments, the diode 529 corresponds to the diode D7. The conductive structure 527 provides an electrical connection to the anode of the diode 529. A conductive structure 528 over and in electrical contact with the N-doped region 516 provides an electrical connection to the cathode of the diode 529. In some embodiments, each or at least one of the conductive structures 527, 528 comprises one or more of an MD contact structure, a VD via, a conductive pattern and a via, all of which are below the Mk layer. In some embodiments, each of the conductive structures 527, 528 is configured to be electrically coupled to an anode or a cathode of another PID protection device, a doped well, or the substrate 510.

Figures 6A, 6B:
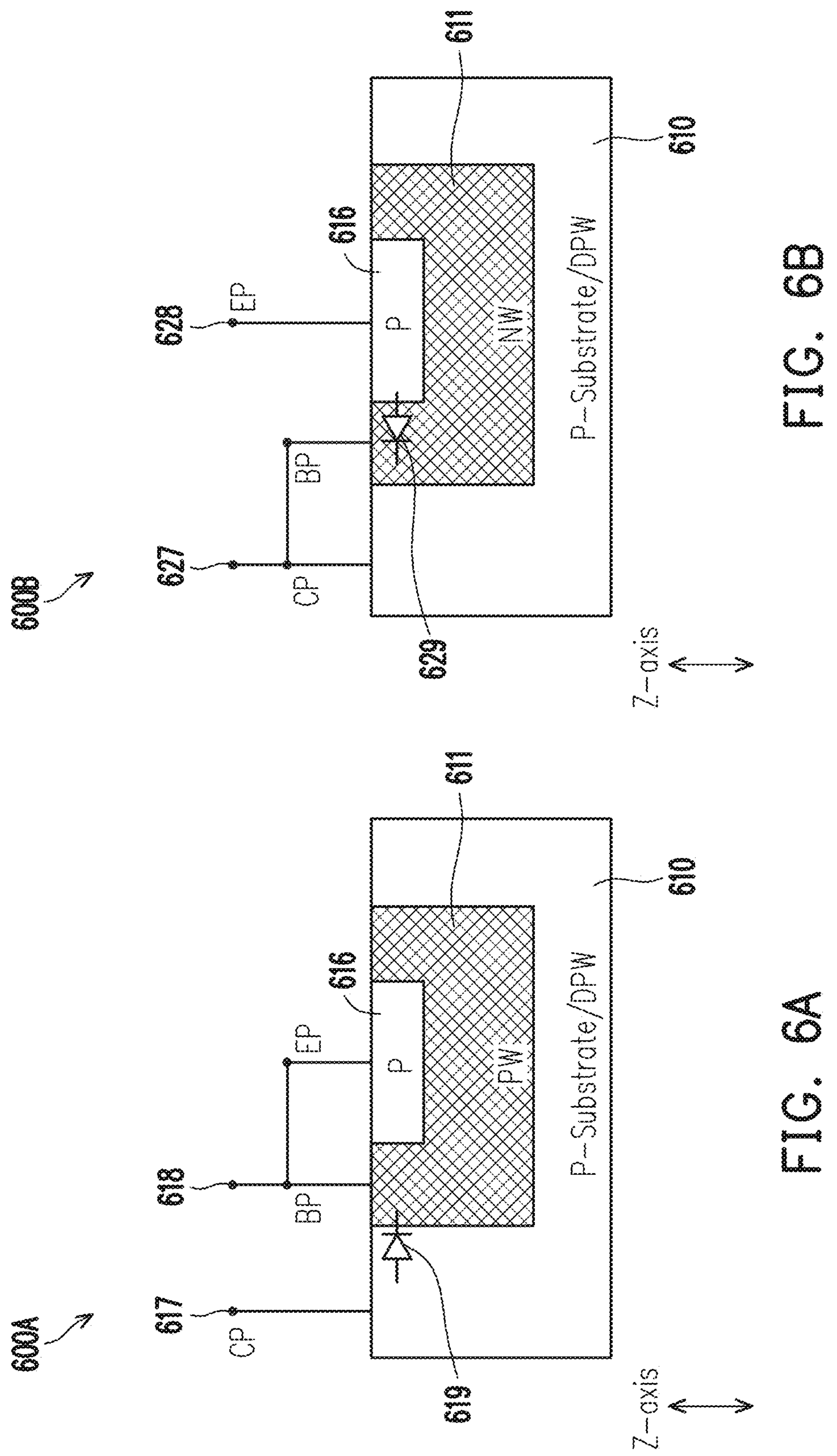

FIG. 6A is a schematic cross-sectional view of a PID protection device 600A, in accordance with some embodiments. In some embodiments, the PID protection device 600A corresponds to any PID protection device in any of PID protection circuits described herein, such as the PID protection circuits 171-174, 179. The PID protection device 600A is a diode-connected PNP BJT which corresponds to the diode-connected PNP BJT 208 in one or more embodiments. The PID protection device 600A is referred to herein as diode-connected PNP BJT 600A.

The diode-connected PNP BJT 600A is formed over a substrate 610. In some embodiments, the substrate 610 corresponds to the substrate 110. In at least one embodiment, the substrate 610 comprises a P-type substrate. In some embodiments, the diode-connected PNP BJT 600A is formed over a P-type doped region, e.g., a deep P-well (DPW). The DPW or P-type substrate forms part of the diode-connected PNP BJT 600A. The diode-connected PNP BJT 600A further comprises an N-well 611, a P-doped region 616, and conductive structures 617, 618.

In some embodiments, the N-well 611 corresponds to, or is similar to, the N-well NW1 or N-well NW2 described with respect to FIG. 1A. The P-doped region 616 corresponds to, or is similar to, P-doped regions described with respect to FIG. 1A. In at least one embodiment, the diode-connected PNP BJT 600A further comprises one or more body contacts, e.g., a substrate tap and/or a well tap, for electrical connection of the conductive structure 617 to the DPW or substrate 610, and for electrical connection of the conductive structure 618 to the N-well 611. In some embodiments, each or at least one of the conductive structures 617, 618 comprises one or more of an MD contact structure, a VD via, a conductive pattern and a via, all of which are below the Mk layer.

The DPW or substrate 610 corresponds to the collector CP of the diode-connected PNP BJT 208. The N-well 611 corresponds to the base BP of the diode-connected PNP BJT 208. The P-doped region 616 corresponds to the emitter EP of the diode-connected PNP BJT 208. The conductive structure 618 electrically couples the base BP and emitter EP of the diode-connected PNP BJT 600A together. As a result, the diode-connected PNP BJT 600A configures a diode 619 at a P-N junction between the N-well 611 and the DPW or substrate 610. The DPW or substrate 610 corresponds to an anode of the diode 619, and the N-well 611 corresponds to a cathode of the diode 619. In some embodiments, the diode 619 corresponds to the diode D8. The conductive structure 617 provides an electrical connection to the anode of the diode 619. The conductive structure 618 provides an electrical connection to the cathode of the diode 619. In some embodiments, each of the conductive structures 617, 618 is configured to be electrically coupled to an anode or a cathode of another PID protection device, a doped well, or the substrate 610.

FIG. 6B is a schematic cross-sectional view of a PID protection device 600B, in accordance with some embodiments. In some embodiments, the PID protection device 600B corresponds to any PID protection device in any of PID protection circuits described herein, such as the PID protection circuits 171-174, 179. The PID protection device 600B is a diode-connected PNP BJT which corresponds to the diode-connected PNP BJT 209 in one or more embodiments. The PID protection device 600B is referred to herein as diode-connected PNP BJT 600B. For simplicity, components of the diode-connected PNP BJT 600B having corresponding components in the diode-connected PNP BJT 600A are designated by the same reference numerals, or by the reference numerals of the diode-connected PNP BJT 600A increased by ten.

The diode-connected PNP BJT 600B comprises a different electrical connection compared to the diode-connected PNP BJT 600A. Specifically, in the diode-connected PNP BJT 600B, a conductive structure 627 electrically couples the base BP and collector CP together. As a result, the diode-connected PNP BJT 600B configures a diode 629 at a P-N junction between the N-well 611 and the P-doped region 616. The P-doped region 616 corresponds to an anode of the diode 629, and the N-well 611 corresponds to a cathode of the diode 629. In some embodiments, the diode 629 corresponds to the diode D9. The conductive structure 627 provides an electrical connection to the cathode of the diode 629. A conductive structure 628 over and in electrical contact with the P-doped region 616 provides an electrical connection to the anode of the diode 629. In some embodiments, each or at least one of the conductive structures 627, 628 comprises one or more of an MD contact structure, a VD via, a conductive pattern and a via, all of which are below the Mk layer. In some embodiments, each of the conductive structures 627, 628 is configured to be electrically coupled to an anode or a cathode of another PID protection device, a doped well, or the substrate 610.

FIGS. 7A-7F include schematic circuit diagrams of PID protection circuits 701-716, 717N-724N, 717P-724P, 725-732, in accordance with some embodiments.

In some embodiments, any of the PID protection circuits 701-716, 717N-724N, 717P-724P, 725-732 corresponds to any of the PID protection circuits 171-174. For simplicity, corresponding components in FIGS. 7A-7F are designated by the same reference numerals of FIG. 2. Although in FIGS. 7A-7F, all PID protection circuits 701-716, 717N-724N, 717P-724P, 725-732 are shown as being electrically coupled between a substrate 751 and a doped well 752 (e.g., an N-well or P-well), this is for illustrative purposes. In some embodiments, not all of the PID protection circuits 701-716, 717N-724N, 717P-724P, 725-732 are included in the same IC device. In some embodiments, any two of the PID protection circuits 701-716, 717N-724N, 717P-724P, 725-732 are included in the same IC device, and are electrically coupled to the same substrate of the IC device but correspondingly to two different doped wells over the substrate. In some embodiments, any two of the PID protection circuits 701-716, 717N-724N, 717P-724P, 725-732 are included in different IC devices, and are electrically coupled to different substrates and different doped wells. In some embodiments, the substrate 751 corresponds to one or more of the substrates 110, 310, 410, 510, 610, and the doped well 752 corresponds to one or more of the described N-wells and/or P-wells over the corresponding substrate. In at least one embodiment, one or more of diodes in one or more of the PID protection circuits 701-716, 717N-724N, 717P-724P, 725-732 correspond to one or more of the PID protection device 203, P-type diode 300A, and N-type diode 300B. In at least one embodiment, one or more of MOS transistors in one or more of the PID protection circuits 701-716, 717N-724N, 717P-724P, 725-732 correspond to one or more of the PID protection devices 204, 205, diode-connected NMOS 400A, and diode-connected PMOS 400B. In at least one embodiment, one or more of BJTs in one or more of the PID protection circuits 701-716, 717N-724N, 717P-724P, 725-732 correspond to one or more of the PID protection devices 206-209, diode-connected NPN BJTs 500A, 500B, and diode-connected PNP BJTs 600A, 600B.

Figure 7A:
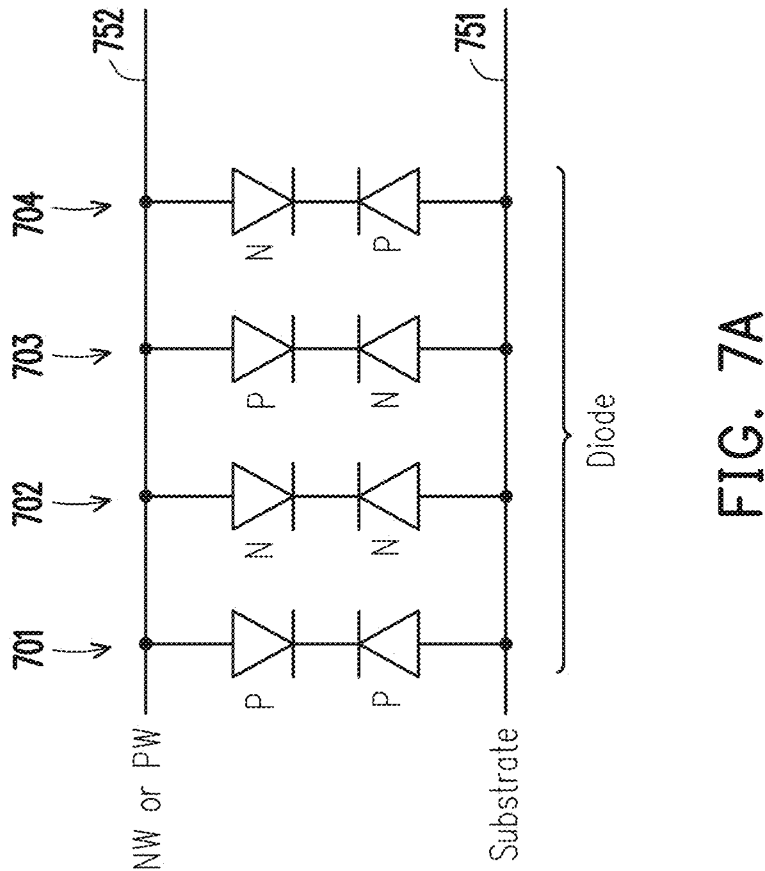
FIGS. 7A-7F include schematic circuit diagrams of various protection circuits, in accordance with some embodiments.

FIG. 7A includes schematic circuit diagrams of the PID protection circuits 701-704 configured from diodes, in accordance with some embodiments.

The PID protection circuit 701 comprises two P-type diodes having cathodes electrically coupled together. An anode of one of the two P-type diodes is electrically coupled to the substrate 751. An anode of the other P-type diode is electrically coupled to the doped well 752.

The PID protection circuit 702 comprises two N-type diodes having cathodes electrically coupled together. An anode of one of the two N-type diodes is electrically coupled to the substrate 751. An anode of the other N-type diode is electrically coupled to the doped well 752.

The PID protection circuit 703 comprises an N-type diode electrically coupled to the substrate 751, and a P-type diode electrically coupled to the doped well 752. The N-type diode and P-type diode have cathodes electrically coupled together. An anode of the N-type diode is electrically coupled to the substrate 751. An anode of the P-type diode is electrically coupled to the doped well 752.

The PID protection circuit 704 comprises a P-type diode electrically coupled to the substrate 751, and an N-type diode electrically coupled to the doped well 752. The N-type diode and P-type diode have cathodes electrically coupled together. An anode of the P-type diode is electrically coupled to the substrate 751. An anode of the N-type diode is electrically coupled to the doped well 752.

In the example configurations in FIG. 7A, the diodes in each of the PID protection circuits 701-704 are electrically coupled in a manner similar to that described with respect to the PID protection circuit 171. In some embodiments, the diodes in each of the PID protection circuits 701-704 are electrically coupled in a manner similar to that described with respect to the PID protection circuit 172.

The PID protection circuits 701-702 include diodes of the same type (i.e., two P-type diodes, or two N-type diodes) electrically coupled to the substrate 751 and the doped well 752, and are selected to be included, in accordance with some embodiments, in IC devices, applications or circuit designs without a working voltage constraint related to working voltages of the substrate 751 and doped well 752 in operation. The PID protection circuits 703-704 include diodes of different types (i.e., one P-type diode and one N-type diode) electrically coupled to the substrate 751 and the doped well 752, and are selected to be included, in accordance with some embodiments, in IC devices, applications or circuit designs with a working voltage constraint. In some embodiments, the working voltage of the substrate 751 is a working voltage of a region outside the doped well 752 and outside a doped region containing the doped well 752. For example, as described with respect to FIG. 1A, a working voltage of the substrate 110 is a working voltage of the region 116 or region 118.

In at least one embodiment where the working voltage of the doped well 752 is higher than the working voltage of the substrate 751, the PID protection circuit 703 is selected, because in this PID protection circuit, a P-type PID protection device (e.g., P-type diode) is on the higher voltage side (e.g., doped well 752), whereas an N-type PID protection device (e.g., N-type diode) is on the lower voltage side (e.g., substrate 751).

In at least one embodiment where the working voltage of the doped well 752 is lower than the working voltage of the substrate 751, the PID protection circuit 704 is selected, because in this PID protection circuits, a P-type PID protection device (e.g., P-type diode) is on the higher voltage side (e.g., substrate 751), whereas an N-type PID protection device (e.g., N-type diode) is on the lower voltage side (e.g., doped well 752).

Figure 7B:
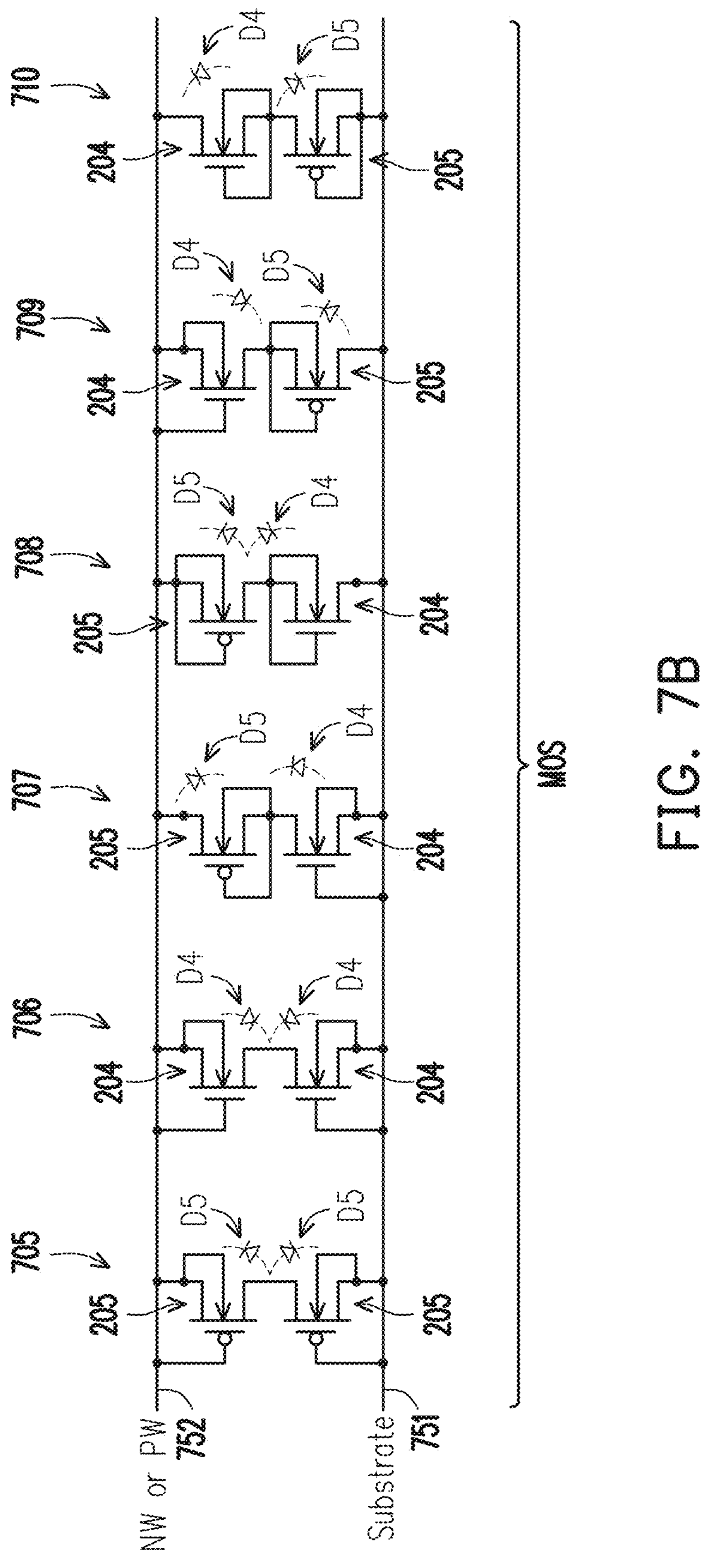

FIG. 7B includes schematic circuit diagrams of the PID protection circuits 705-710 configured from MOS transistors, in accordance with some embodiments.

The PID protection circuit 705 comprises two diode-connected PMOSs 205 electrically coupled in such a manner that the corresponding diodes D5 have anodes electrically coupled together. A cathode of one of the two diodes D5 is electrically coupled to the substrate 751. A cathode of the other diode D5 is electrically coupled to the doped well 752.

The PID protection circuit 706 comprises two diode-connected NMOSs 204 electrically coupled in such a manner that the corresponding diodes D4 have cathodes electrically coupled together. An anode of one of the two diodes D4 is electrically coupled to the substrate 751. An anode of the other diode D4 is electrically coupled to the doped well 752.

The PID protection circuit 707 comprises a diode-connected PMOS 205 electrically coupled to the doped well 752, and a diode-connected NMOS 204 electrically coupled to the substrate 751. The diode-connected PMOS 205 and diode-connected NMOS 204 are electrically coupled in such a manner that the corresponding diodes D5 and D4 have cathodes electrically coupled together. An anode of the diode D5 is electrically coupled to the doped well 752. An anode of the diode D4 is electrically coupled to the substrate 751.

The PID protection circuit 708 comprises a diode-connected PMOS 205 electrically coupled to the doped well 752, and a diode-connected NMOS 204 electrically coupled to the substrate 751. The diode-connected PMOS 205 and diode-connected NMOS 204 are electrically coupled in such a manner that the corresponding diodes D5 and D4 have anodes electrically coupled together. A cathode of the diode D5 is electrically coupled to the doped well 752. A cathode of the diode D4 is electrically coupled to the substrate 751.

The PID protection circuit 709 comprises a diode-connected PMOS 205 electrically coupled to the substrate 751, and a diode-connected NMOS 204 electrically coupled to the doped well 752. The diode-connected PMOS 205 and diode-connected NMOS 204 are electrically coupled in such a manner that the corresponding diodes D5 and D4 have cathodes electrically coupled together. An anode of the diode D5 is electrically coupled to the substrate 751. An anode of the diode D4 is electrically coupled to the doped well 752.

The PID protection circuit 710 comprises a diode-connected PMOS 205 electrically coupled to the substrate 751, and a diode-connected NMOS 204 electrically coupled to the doped well 752. The diode-connected PMOS 205 and diode-connected NMOS 204 are electrically coupled in such a manner that the corresponding diodes D5 and D4 have anodes electrically coupled together. A cathode of the diode D5 is electrically coupled to the substrate 751. A cathode of the diode D4 is electrically coupled to the doped well 752.

In at least one embodiment where there is no working voltage constraint related to working voltages of the substrate 751 and doped well 752 in operation, one of the PID protection circuits 705, 706 is selected, because in these PID protection circuits, both PID protection devices are of the same type, i.e., both PID protection devices are P-type devices (e.g., two PMOSs), or both PID protection devices are N-type devices (e.g., two NMOSs).

In at least one embodiment where the working voltage of the doped well 752 is higher than the working voltage of the substrate 751, one of the PID protection circuits 707, 708 is selected, because in these PID protection circuits, a P-type PID protection device (e.g., PMOS) is on the higher voltage side (e.g., doped well 752), whereas an N-type PID protection device (e.g., NMOS) is on the lower voltage side (e.g., substrate 751).

In at least one embodiment where the working voltage of the doped well 752 is lower than the working voltage of the substrate 751, one of the PID protection circuits 709, 710 is selected, because in these PID protection circuits, a P-type PID protection device (e.g., PMOS) is on the higher voltage side (e.g., substrate 751), whereas an N-type PID protection device (e.g., NMOS) is on the lower voltage side (e.g., doped well 752).

Figure 7C:
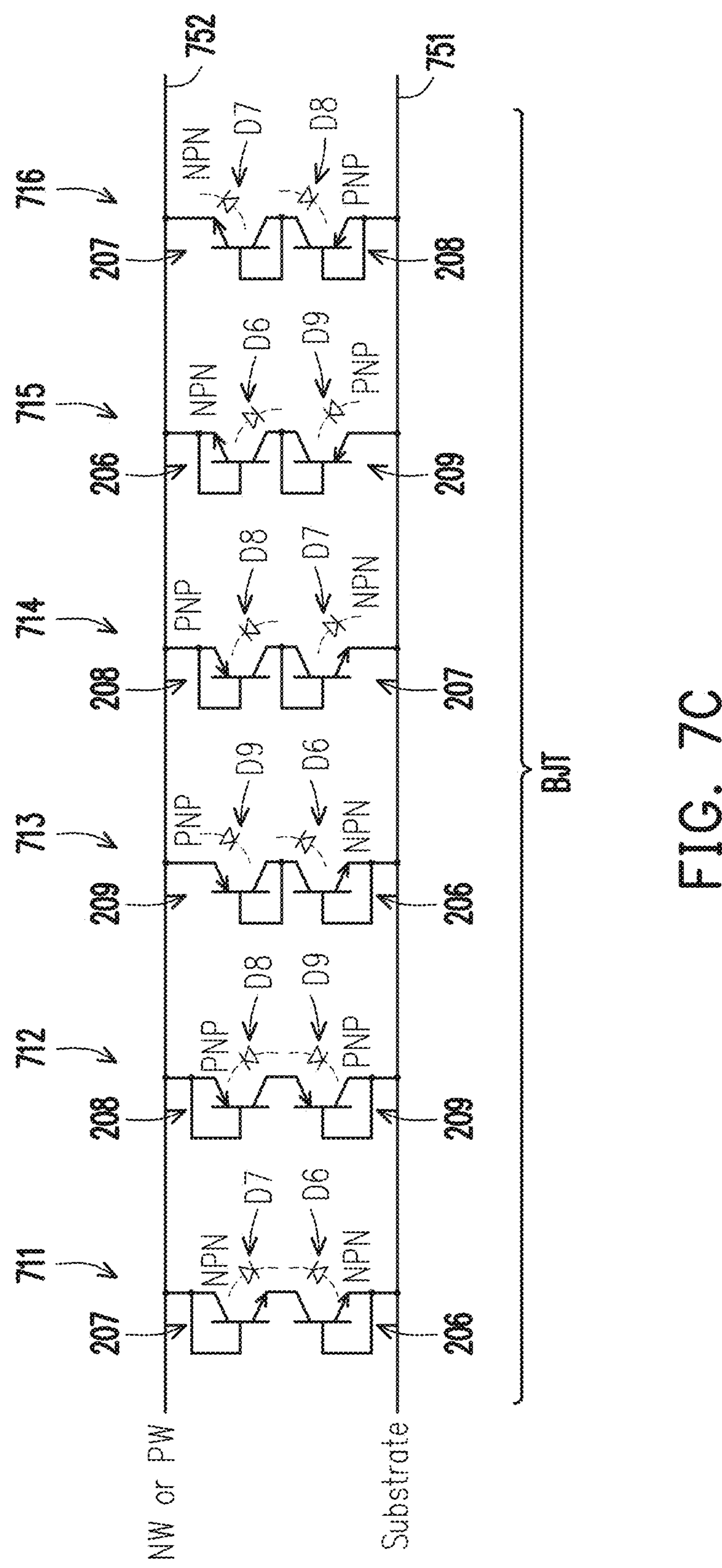

FIG. 7C includes schematic circuit diagrams of the PID protection circuits 711-716 configured from BJTs, in accordance with some embodiments.

The PID protection circuit 711 comprises a diode-connected NPN BJT 206 electrically coupled to the substrate 751, and a diode-connected NPN BJT 207 electrically coupled to the doped well 752. The diode-connected NPN BJT 206 and diode-connected NPN BJT 207 are electrically coupled in such a manner that the corresponding diodes D6 and D7 have cathodes electrically coupled together. An anode of the diode D6 is electrically coupled to the substrate 751. An anode of the diode D7 is electrically coupled to the doped well 752.

The PID protection circuit 712 comprises a diode-connected PNP BJT 209 electrically coupled to the substrate 751, and a diode-connected PNP BJT 208 electrically coupled to the doped well 752. The diode-connected PNP BJT 208 and diode-connected PNP BJT 209 are electrically coupled in such a manner that the corresponding diodes D8 and D9 have anodes electrically coupled together. A cathode of the diode D9 is electrically coupled to the substrate 751. A cathode of the diode D8 is electrically coupled to the doped well 752.

The PID protection circuit 713 comprises a diode-connected NPN BJT 206 electrically coupled to the substrate 751, and a diode-connected PNP BJT 209 electrically coupled to the doped well 752. The diode-connected NPN BJT 206 and diode-connected PNP BJT 209 are electrically coupled in such a manner that the corresponding diodes D6 and D9 have cathodes electrically coupled together. An anode of the diode D6 is electrically coupled to the substrate 751. An anode of the diode D9 is electrically coupled to the doped well 752.

The PID protection circuit 714 comprises a diode-connected NPN BJT 207 electrically coupled to the substrate 751, and a diode-connected PNP BJT 208 electrically coupled to the doped well 752. The diode-connected NPN BJT 207 and diode-connected PNP BJT 208 are electrically coupled in such a manner that the corresponding diodes D7 and D8 have anodes electrically coupled together. A cathode of the diode D7 is electrically coupled to the substrate 751. A cathode of the diode D8 is electrically coupled to the doped well 752.

The PID protection circuit 715 comprises a diode-connected PNP BJT 209 electrically coupled to the substrate 751, and a diode-connected NPN BJT 206 electrically coupled to the doped well 752. The diode-connected NPN BJT 206 and diode-connected PNP BJT 209 are electrically coupled in such a manner that the corresponding diodes D6 and D9 have cathodes electrically coupled together. An anode of the diode D9 is electrically coupled to the substrate 751. An anode of the diode D6 is electrically coupled to the doped well 752.

The PID protection circuit 716 comprises a diode-connected PNP BJT 208 electrically coupled to the substrate 751, and a diode-connected NPN BJT 207 electrically coupled to the doped well 752. The diode-connected NPN BJT 207 and diode-connected PNP BJT 208 are electrically coupled in such a manner that the corresponding diodes D7 and D8 have anodes electrically coupled together. A cathode of the diode D8 is electrically coupled to the substrate 751. A cathode of the diode D7 is electrically coupled to the doped well 752.

In at least one embodiment where there is no working voltage constraint related to working voltages of the substrate 751 and doped well 752 in operation, one of the PID protection circuits 711, 712 is selected, because in these PID protection circuits, both PID protection devices are of the same type, i.e., both PID protection devices are P-type devices (e.g., two PNP BJTs), or both PID protection devices are N-type devices (e.g., two NPN BJTs).

In at least one embodiment where the working voltage of the doped well 752 is higher than the working voltage of the substrate 751, one of the PID protection circuits 713, 714 is selected, because in these PID protection circuits, a P-type PID protection device (e.g., PNP BJT) is on the higher voltage side (e.g., doped well 752), whereas an N-type PID protection device (e.g., NPN BJT) is on the lower voltage side (e.g., substrate 751).

In at least one embodiment where the working voltage of the doped well 752 is lower than the working voltage of the substrate 751, one of the PID protection circuits 715, 716 is selected, because in these PID protection circuits, a P-type PID protection device (e.g., PNP BJT) is on the higher voltage side (e.g., substrate 751), whereas an N-type PID protection device (e.g., NPN BJT) is on the lower voltage side (e.g., doped well 752).

Figure 7D:
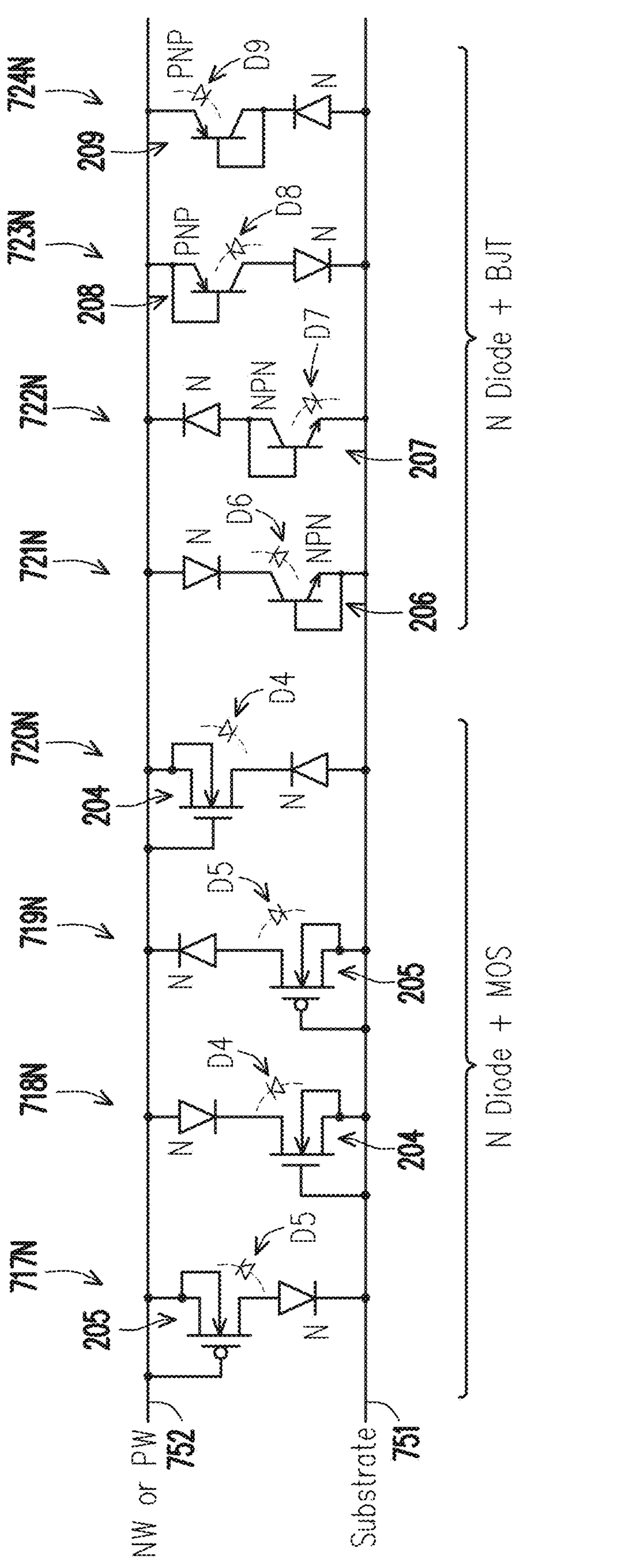

FIG. 7D includes schematic circuit diagrams of the PID protection circuits 717N-720N configured from N-type diodes and MOS transistors, in accordance with some embodiments.

The PID protection circuit 717N comprises an N-type diode electrically coupled to the substrate 751, and a diode-connected PMOS 205 electrically coupled to the doped well 752. The N-type diode and the corresponding N-type diode D5 of the diode-connected PMOS 205 have anodes electrically coupled together. A cathode of the N-type diode is electrically coupled to the substrate 751. A cathode of the N-type diode D5 is electrically coupled to the doped well 752.

The PID protection circuit 718N comprises an N-type diode electrically coupled to the doped well 752, and a diode-connected NMOS 204 electrically coupled to the substrate 751. The N-type diode and the corresponding N-type diode D4 of the diode-connected NMOS 204 have cathodes electrically coupled together. An anode of the N-type diode is electrically coupled to the doped well 752. An anode of the N-type diode D4 is electrically coupled to the substrate 751.

The PID protection circuit 719N comprises an N-type diode electrically coupled to the doped well 752, and a diode-connected PMOS 205 electrically coupled to the substrate 751. The N-type diode and the corresponding N-type diode D5 of the diode-connected PMOS 205 have anodes electrically coupled together. A cathode of the N-type diode is electrically coupled to the doped well 752. A cathode of the N-type diode D5 is electrically coupled to the substrate 751.

The PID protection circuit 720N comprises an N-type diode electrically coupled to the substrate 751, and a diode-connected NMOS 204 electrically coupled to the doped well 752. The N-type diode and the corresponding N-type diode D4 of the diode-connected NMOS 204 have cathodes electrically coupled together. An anode of the N-type diode is electrically coupled to the substrate 751. An anode of the N-type diode D4 is electrically coupled to the doped well 752.

FIG. 7D further includes schematic circuit diagrams of the PID protection circuits 721N-724N configured from N-type diodes and BJTs, in accordance with some embodiments.

The PID protection circuit 721N comprises an N-type diode electrically coupled to the doped well 752, and a diode-connected NPN BJT 206 electrically coupled to the substrate 751. The N-type diode and the corresponding N-type diode D6 of the diode-connected NPN BJT 206 have cathodes electrically coupled together. An anode of the N-type diode is electrically coupled to the doped well 752. An anode of the N-type diode D6 is electrically coupled to the substrate 751.

The PID protection circuit 722N comprises an N-type diode electrically coupled to the doped well 752, and a diode-connected NPN BJT 207 electrically coupled to the substrate 751. The N-type diode and the corresponding N-type diode D7 of the diode-connected NPN BJT 207 have anodes electrically coupled together. A cathode of the N-type diode is electrically coupled to the doped well 752. A cathode of the N-type diode D7 is electrically coupled to the substrate 751.

The PID protection circuit 723N comprises an N-type diode electrically coupled to the substrate 751, and a diode-connected PNP BJT 208 electrically coupled to the doped well 752. The N-type diode and the corresponding N-type diode D8 of the diode-connected PNP BJT 208 have anodes electrically coupled together. A cathode of the N-type diode is electrically coupled to the substrate 751. A cathode of the N-type diode D8 is electrically coupled to the doped well 752.

The PID protection circuit 724N comprises an N-type diode electrically coupled to the substrate 751, and a diode-connected PNP BJT 209 electrically coupled to the doped well 752. The N-type diode and the corresponding N-type diode D9 of the diode-connected PNP BJT 209 have cathodes electrically coupled together. An anode of the N-type diode is electrically coupled to the substrate 751. An anode of the N-type diode D9 is electrically coupled to the doped well 752.

In at least one embodiment where there is no working voltage constraint related to working voltages of the substrate 751 and doped well 752 in operation, one of the PID protection circuits 718N, 720N, 721N, 722N is selected, because in these PID protection circuits, both PID protection devices are of the same type, i.e., both PID protection devices are N-type devices (e.g., N-type diode and NMOS, or N-type diode and NPN BJT).

In at least one embodiment where the working voltage of the doped well 752 is higher than the working voltage of the substrate 751, one of the PID protection circuits 717N, 723N, 724N is selected, because in these PID protection circuits, a P-type PID protection device (e.g., PMOS or PNP BJT) is on the higher voltage side (e.g., doped well 752), whereas an N-type PID protection device (e.g., N-type diode) is on the lower voltage side (e.g., substrate 751).

In at least one embodiment where the working voltage of the doped well 752 is lower than the working voltage of the substrate 751, the PID protection circuit 719N is selected because in this PID protection circuit, a P-type PID protection device (e.g., PMOS) is on the higher voltage side (e.g., substrate 751), whereas an N-type PID protection device (e.g., N-type diode) is on the lower voltage side (e.g., doped well 752).

Figure 7E:
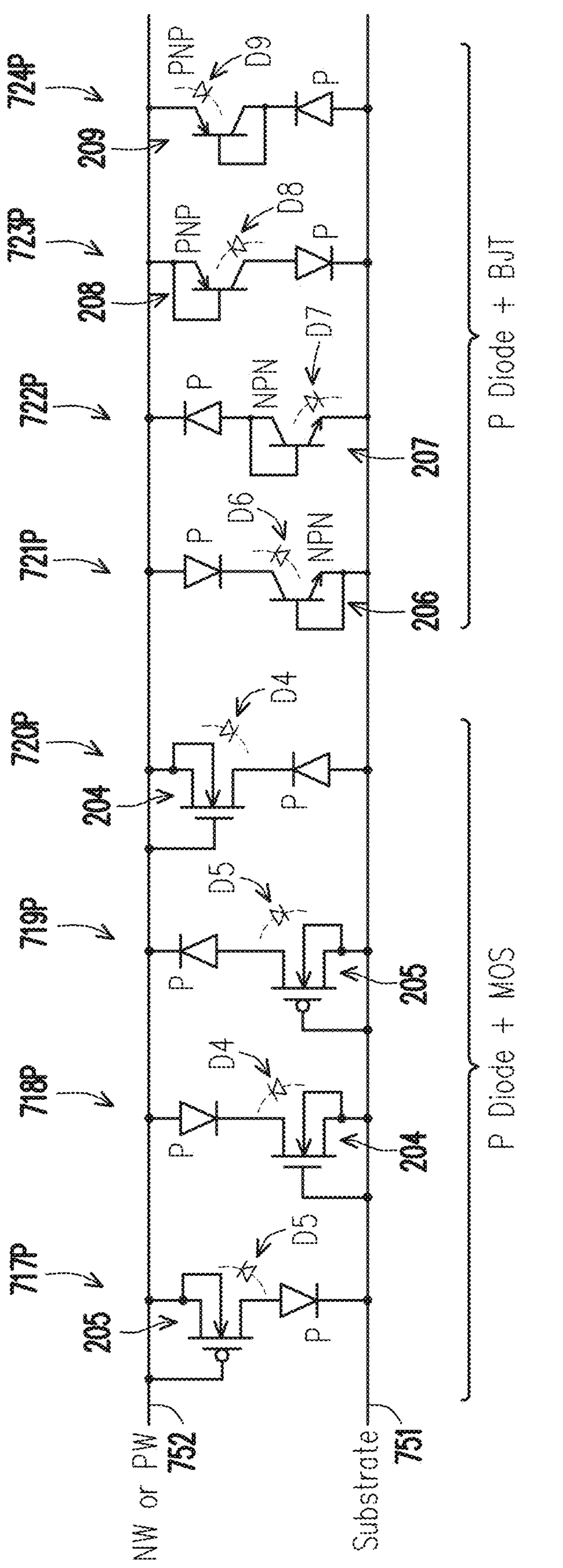

FIG. 7E includes schematic circuit diagrams of the PID protection circuits 717P-720P configured from P-type diodes and MOS transistors, in accordance with some embodiments. FIG. 7E further includes schematic circuit diagrams of the PID protection circuits 721P-724P configured from P-type diodes and BJTs, in accordance with some embodiments.

The PID protection circuits 717P-724P correspond to the PID protection circuits 717N-724N, with a difference that the N-type diodes in the PID protection circuits 717N-724N are replaced with P-type diodes in the PID protection circuits 717P-724P.

In at least one embodiment where there is no working voltage constraint related to working voltages of the substrate 751 and doped well 752 in operation, one of the PID protection circuits 717P, 719P, 723P, 724P is selected, because in these PID protection circuits, both PID protection devices are of the same type, i.e., both PID protection devices are P-type devices (e.g., P-type diode and PMOS, or P-type diode and PNP BJT).

In at least one embodiment where the working voltage of the doped well 752 is higher than the working voltage of the substrate 751, one of the PID protection circuits 718P, 721P, 722P is selected, because in these PID protection circuits, a P-type PID protection device (e.g., P-type diode) is on the higher voltage side (e.g., doped well 752), whereas an N-type PID protection device (e.g., NMOS or NPN BJT) is on the lower voltage side (e.g., substrate 751).

In at least one embodiment where the working voltage of the doped well 752 is lower than the working voltage of the substrate 751, the PID protection circuit 720P is selected because in this PID protection circuit, a P-type PID protection device (e.g., P-type diode) is on the higher voltage side (e.g., substrate 751), whereas an N-type PID protection device (e.g., NMOS) is on the lower voltage side (e.g., doped well 752).

Figure 7F:
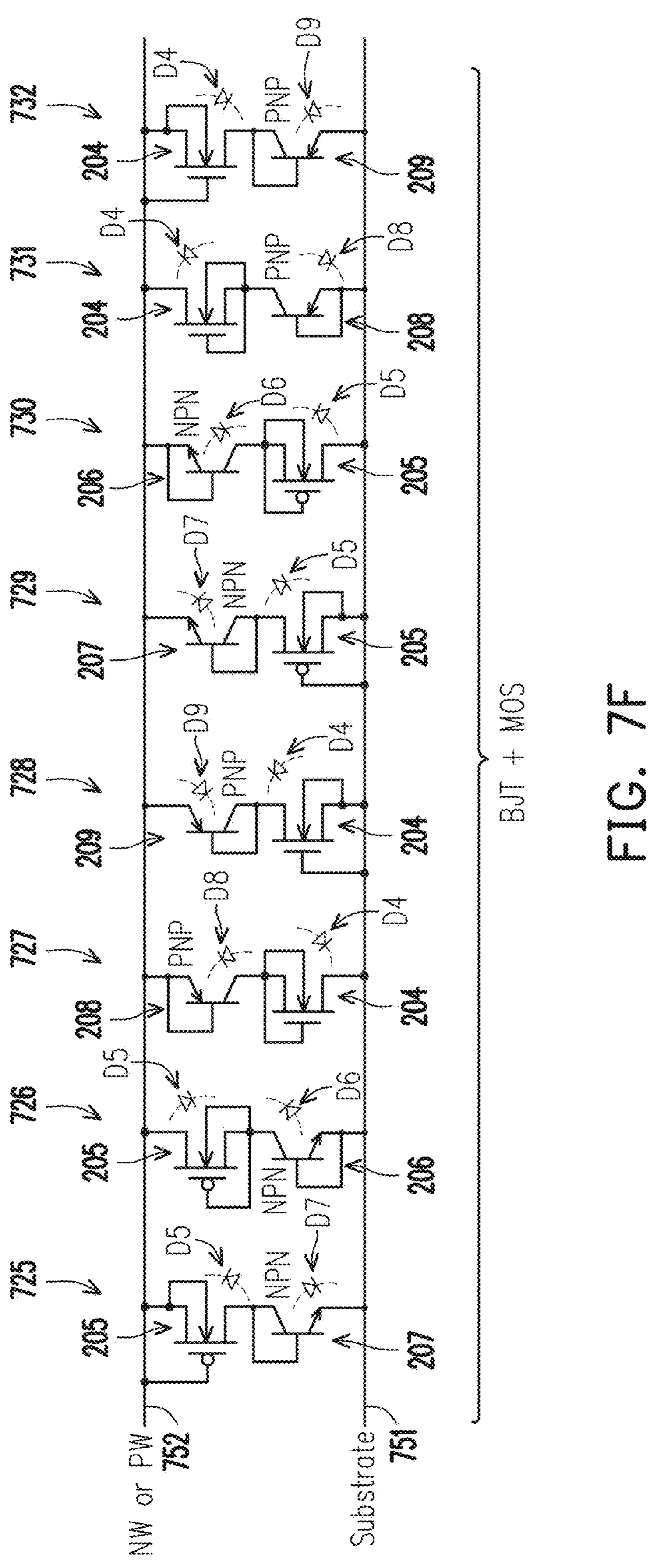

FIG. 7F includes schematic circuit diagrams of the PID protection circuits 725-732 configured from BJTs and MOS transistors, in accordance with some embodiments.

The PID protection circuit 725 comprises a diode-connected NPN BJT 207 electrically coupled to the substrate 751, and a diode-connected PMOS 205 electrically coupled to the doped well 752. The diode-connected NPN BJT 207 and diode-connected PMOS 205 are electrically coupled in such a manner that the corresponding diodes D7 and D5 have anodes electrically coupled together. A cathode of the diode D7 is electrically coupled to the substrate 751. A cathode of the diode D5 is electrically coupled to the doped well 752.

The PID protection circuit 726 comprises a diode-connected NPN BJT 206 electrically coupled to the substrate 751, and a diode-connected PMOS 205 electrically coupled to the doped well 752. The diode-connected NPN BJT 206 and diode-connected PMOS 205 are electrically coupled in such a manner that the corresponding diodes D6 and D5 have cathodes electrically coupled together. An anode of the diode D6 is electrically coupled to the substrate 751. An anode of the diode D5 is electrically coupled to the doped well 752.

The PID protection circuit 727 comprises a diode-connected NMOS 204 electrically coupled to the substrate 751, and a diode-connected PNP BJT 208 electrically coupled to the doped well 752. The diode-connected NMOS 204 and diode-connected PNP BJT 208 are electrically coupled in such a manner that the corresponding diodes D4 and D8 have anodes electrically coupled together. A cathode of the diode D4 is electrically coupled to the substrate 751. A cathode of the diode D8 is electrically coupled to the doped well 752.

The PID protection circuit 728 comprises a diode-connected NMOS 204 electrically coupled to the substrate 751, and a diode-connected PNP BJT 209 electrically coupled to the doped well 752. The diode-connected NMOS 204 and diode-connected PNP BJT 209 are electrically coupled in such a manner that the corresponding diodes D4 and D9 have cathodes electrically coupled together. An anode of the diode D4 is electrically coupled to the substrate 751. An anode of the diode D9 is electrically coupled to the doped well 752.

The PID protection circuit 729 comprises a diode-connected PMOS 205 electrically coupled to the substrate 751, and a diode-connected NPN BJT 207 electrically coupled to the doped well 752. The diode-connected PMOS 205 and diode-connected NPN BJT 207 are electrically coupled in such a manner that the corresponding diodes D5 and D7 have anodes electrically coupled together. A cathode of the diode D5 is electrically coupled to the substrate 751. A cathode of the diode D7 is electrically coupled to the doped well 752.

The PID protection circuit 730 comprises a diode-connected PMOS 205 electrically coupled to the substrate 751, and a diode-connected NPN BJT 206 electrically coupled to the doped well 752. The diode-connected PMOS 205 and diode-connected NPN BJT 206 are electrically coupled in such a manner that the corresponding diodes D5 and D6 have cathodes electrically coupled together. An anode of the diode D5 is electrically coupled to the substrate 751. An anode of the diode D6 is electrically coupled to the doped well 752.

The PID protection circuit 731 comprises a diode-connected PNP BJT 208 electrically coupled to the substrate 751, and a diode-connected NMOS 204 electrically coupled to the doped well 752. The diode-connected NMOS 204 and diode-connected PNP BJT 208 are electrically coupled in such a manner that the corresponding diodes D4 and D8 have anodes electrically coupled together. A cathode of the diode D8 is electrically coupled to the substrate 751. A cathode of the diode D4 is electrically coupled to the doped well 752.

The PID protection circuit 732 comprises a diode-connected PNP BJT 209 electrically coupled to the substrate 751, and a diode-connected NMOS 204 electrically coupled to the doped well 752. The diode-connected PNP BJT 209 and diode-connected NMOS 204 are electrically coupled in such a manner that the corresponding diodes D9 and D4 have cathodes electrically coupled together. An anode of the diode D9 is electrically coupled to the substrate 751. An anode of the diode D4 is electrically coupled to the doped well 752.

In at least one embodiment where the working voltage of the doped well 752 is higher than the working voltage of the substrate 751, one of the PID protection circuits 725-728 is selected, because in these PID protection circuits, a P-type PID protection device (e.g., PMOS or PNP BJT) is on the higher voltage side (e.g., doped well 752), whereas an N-type PID protection device (e.g., NMOS or NPN BJT) is on the lower voltage side (e.g., substrate 751).

In at least one embodiment where the working voltage of the doped well 752 is lower than the working voltage of the substrate 751, one of the PID protection circuits 729-732 is selected, because in these PID protection circuits, a P-type PID protection device (e.g., PMOS or PNP BJT) is on the higher voltage side (e.g., substrate 751), whereas an N-type PID protection device (e.g., NMOS or NPN BJT) is on the lower voltage side (e.g., doped well 752).

In at least one embodiment, PID protection provided by a PID protection device is related to the PID protection device's resistance to leakage current, i.e., a PID protection device with lower resistance to leakage current provides better PID protection than a PID protection device with higher resistance to leakage current. In some embodiments, a BJT has smaller resistance to leakage current (i.e., better PID protection) than a diode which, in turn, has smaller resistance to leakage current (i.e., better PID protection) than a MOS transistor. A MOS transistor, however, occupies a smaller chip area than a diode which, in turn, occupies a smaller chip area than a BJT. In some embodiments, the PID protection circuits 711-716 configured from BJTs provide better PID protection but occupy a larger chip area than the PID protection circuits 701-704 configured from diodes, and the PID protection circuits 701-704 configured from diodes provide better PID protection but occupy a larger chip area than the PID protection circuits 705-710 configured from MOS transistors.

In at least one embodiment, a balance between an intended level of PID protection and a chip area occupied by PID protection circuits (i.e., a chip area not usable for functional circuits) is a design consideration in selecting one or more PID protection circuits for an IC device. For example, in applications or circuit designs where strong PID protection is a more important design consideration than the chip area occupied by PID protection circuits, one or more of the PID protection circuits 711-716 configured from BJTs are selected to be included in an IC device to be designed and/or manufactured. For another example, in applications or circuit designs where minimizing the chip area occupied by PID protection circuits is a more important design consideration, one or more of the PID protection circuits 705-710 configured from MOS transistors are selected to be included in the IC device. In a further example where PID protection and chip area occupied by PID protection circuits are design considerations of about the same importance, one or more of the PID protection circuits 701-704 configured from diodes are selected to be included in the IC device.

In some embodiments, another design consideration for selecting a particular PID protection circuit for an IC device comprises a working voltage constraint, or lack thereof. The working voltage constraint is related to working voltages of a substrate and a doped well over the substrate, as described herein. For example, where there is no working voltage constraint, one or more of the PID protection circuits 701-702, 705-706, 711-712, 718N, 720N, 721N, 722N, 717P, 719P, 723P, 724P (sometimes referred to herein as a first set of PID protection circuits) are selected. For another example, when the working voltage of the doped well is higher than the working voltage of the substrate, one or more of the PID protection circuits 703, 707-708, 713-714, 717N, 723N, 724N, 718P, 721P, 722P, 725-728 (sometimes referred to herein as a second set of PID protection circuits) are selected for discharging electric charges in the doped well to the substrate. In a further example where the working voltage of the doped well is lower than the working voltage of the substrate, one or more of the PID protection circuits 704, 709-710, 715-716, 719N, 720P, 729-732 (sometimes referred to herein as a third set of PID protection circuits), are selected for discharging electric charges in the doped well to the substrate.

In some embodiments, a further design consideration for selecting a particular PID protection circuit comprises minimizing the number of masks used in manufacture. For this purpose, one or more "hybrid solutions," i.e., the PID protection circuits 717N-724N, 717P-724P, 725-732 each configured from PID protection devices of different types, are selected in one or more embodiments. As described herein, PID protection devices and circuits in accordance with some embodiments include many features, e.g., doped regions, doped wells, substrate taps, well taps, vias, interconnects, or the like, which are similar to features of the functional circuits. As a result, it is possible in one or more embodiments to manufacture PID protection circuits together with functional circuits of an IC device, by using the same masks or with a minimal number of added masks. In some embodiments, one or more of the "hybrid" PID protection circuits 717N-724N, 717P-724P, 725-732 are selected based on the types of semiconductor devices of functional circuits in a chip region where the PID protection circuit is to be formed and/or the layout of the functional circuits in or around the chip region, so as to minimize the number of added masks. Other considerations for determining which PID protection circuit configuration is to be used for discharging a particular doped well to the substrate are within the scopes of various embodiments.

The PID protection circuits 701-716, 717N-724N, 717P-724P, 725-732 are examples of PID protection circuits configurable from various combinations of the PID protection devices 203-209. The PID protection circuits 701-716, 717N-724N, 717P-724P, 725-732 are not intended to constitute an exhaustive list of all PID protection circuits configurable from the PID protection devices 203-209. Other PID protection circuit configurations are within the scopes of various embodiments. For example, in one or more embodiments, PID protection circuits each comprising more than two of the PID protection devices 203-209 are configurable as described with respect to the PID protection circuit 179. In at least one embodiment, one or more advantages described herein are achievable by IC devices comprising one or more of the described PID protection circuits.

Figure 8A:
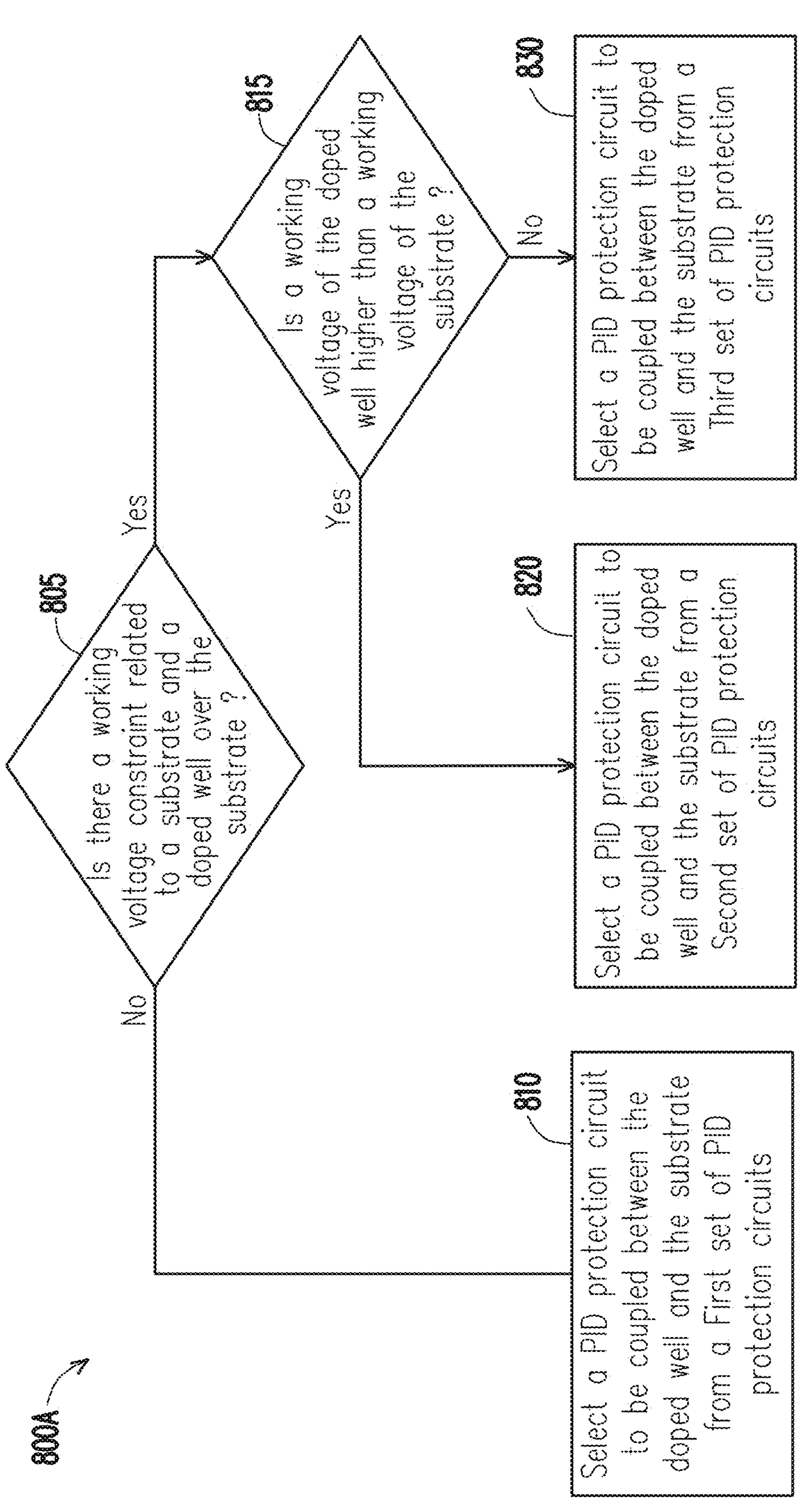
FIGS. 8A-8B are flowcharts of various methods of manufacturing IC devices, in accordance with some embodiments.

FIG. 8A is a flowchart of a method 800A of manufacturing an IC device, in accordance with some embodiments. In some embodiments, the IC device corresponds to one or more of IC devices described with respect to FIGS. 1A-1B, and any IC device comprising a PID protection device and/or a PID protection circuit described with respect to FIGS. 2-7F. In some embodiments, the method 800A is performed during a design stage. In at least one embodiment, the method 800A is performed by a processor of a computer system. The computer system further comprises a non-transitory computer-readable storage medium coupled to the processor, and configured to store computer-executable instructions which, when executed by the processor, cause the processor to perform the method 800A. An example of such a computer system is an electronic design automation (EDA) system.

At operation 805, it is determined whether there is a working voltage constraint related to a substrate and a doped well over the substrate. For example, as described with respect to FIGS. 7A-7F, it is determined whether there is a working voltage constraint related to a substrate 751 and a doped well 752 over the substrate. In some embodiments, a determination is made based on a circuit design of the IC device and/or a layout of the IC device.

At operation 810, in response to a negative determination (i.e., "No") at operation 805 indicating that there is no working voltage constraint related to the substrate and the doped well, a PID protection circuit to be coupled between the doped well and the substrate is selected from a first set of PID protection circuits. For example, as described with respect to FIGS. 7A-7F, in response to determining that there is no working voltage constraint related to the substrate 751 and the doped well 752, a PID protection circuit to be coupled between the substrate 751 and doped well 752 is selected from a first set including PID protection circuits 701-702, 705-706, 711-712, 718N, 720N, 721N, 722N, 717P, 719P, 723P, 724P.

At operation 815, in response to a positive determination (i.e., "Yes") at operation 805 indicating that there is a working voltage constraint related to the substrate and the doped well, it is determined whether a working voltage of the doped well is higher than a working voltage of the substrate. For example, as described with respect to FIGS. 7A-7F, it is determined whether a working voltage of the doped well 752 is higher than a working voltage of the substrate 751.

At operation 820, in response to a positive determination (i.e., "Yes") at operation 815 indicating that the working voltage of the doped well is higher than the working voltage of the substrate, a PID protection circuit to be coupled between the doped well and the substrate is selected from a second set of PID protection circuits different from the first set of PID protection circuits. For example, as described with respect to FIGS. 7A-7F, in response to determining that the working voltage of the doped well 752 is higher than the working voltage of the substrate 751, a PID protection circuit to be coupled between the substrate 751 and doped well 752 is selected from a second set including PID protection circuits 703, 707-708, 713-714, 717N, 723N, 724N, 718P, 721P, 722P, 725-728.

At operation 830, in response to a negative determination (i.e., "No") at operation 815 indicating that the working voltage of the doped well is not higher than the working voltage of the substrate, a PID protection circuit to be coupled between the doped well and the substrate is selected from a third set of PID protection circuits different from the first and second sets of PID protection circuits. For example, as described with respect to FIGS. 7A-7F, in response to determining that the working voltage of the doped well 752 is not higher than the working voltage of the substrate 751, a PID protection circuit to be coupled between the substrate 751 and doped well 752 is selected from a third set including PID protection circuits 704, 709-710, 715-716, 719N, 720P, 729-732.

In some embodiments, a PID protection circuit to be coupled between the substrate 751 and doped well 752 is selected from one of the first-third sets, based on one or more further considerations as described herein. For example, such further considerations include, but are not limited to, the intended level of PID protection, the chip area occupied by the PID protection circuit, types and/or layouts of adjacent semiconductor devices for mask minimization, or the like. In some embodiments, upon selecting a PID protection circuit from one of the first-third sets, the process proceeds to subsequent operations, e.g., for manufacturing the IC device.

Figure 8B:
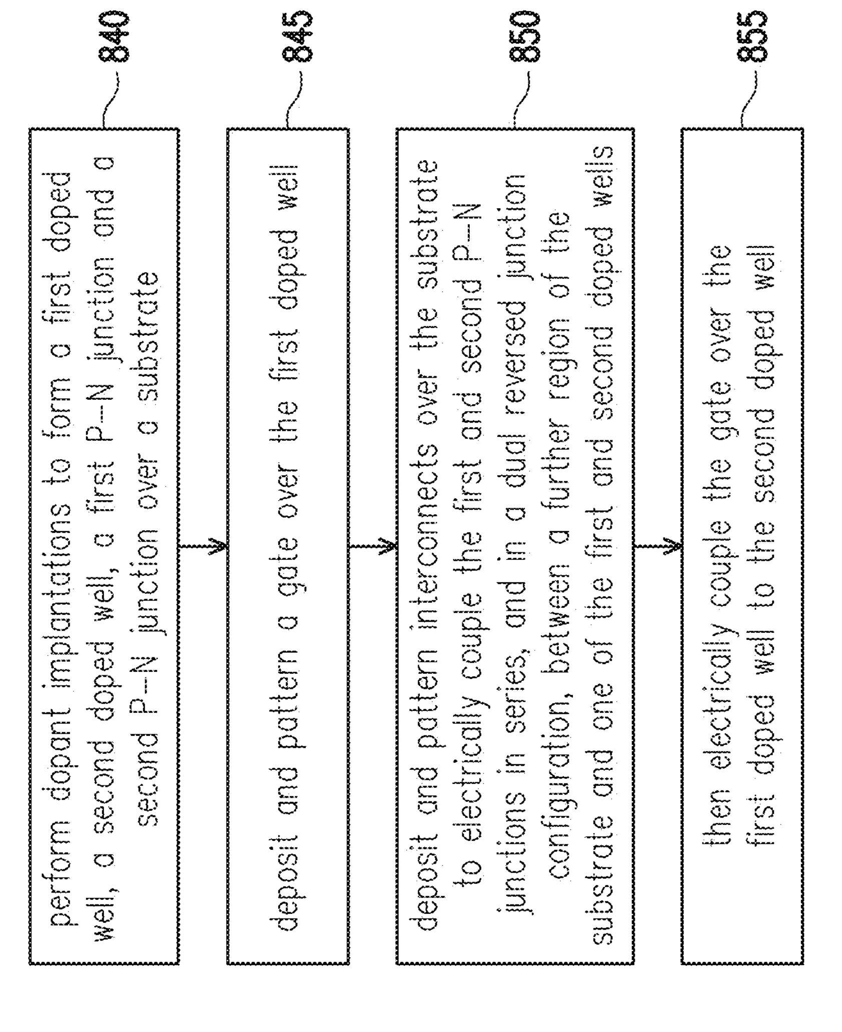

FIG. 8B is a flowchart of a method 800B of manufacturing an IC device, in accordance with some embodiments. In some embodiments, the method 800B is usable to manufacture one or more IC devices described with respect to FIGS. 1A-1B, and any IC device comprising a PID protection device and/or a PID protection circuit described with respect to FIGS. 2-7F.

At operation 840, dopant implantations are performed to form a first doped well, a second doped well, a first P-N junction and a second P-N junction over a substrate. In some embodiments, as described with respect to FIG. 1A, the first doped well includes any of the P-well PW1 or the N-well NW1, and the second doped well includes any of the P-well PW2 or the N-well NW2. In some embodiments, as described with respect to one or more of FIGS. 3A-6B, the first or second P-N junction includes any P-N junction that configures any of the diodes 319, 329, 339, 349, 449, 499, 519, 529, 619, 629. For example, the first P-N junction corresponds to one of the diodes 175, 176, and the second P-N junction corresponds to the other of the diodes 175, 176. For another example, the first P-N junction corresponds to one of the diodes 177, 178, and the second P-N junction corresponds to the other of the diodes 177, 178.

At operation 845, a gate is deposited and patterned over the first doped well. In an example, as described with respect to FIG. 1A, the gate includes a gate 122 when the first doped well includes the P-well PW1, or the gate includes a gate 132 when the first doped well includes the N-well NW1.

At operations 850, 855, a redistribution structure is fabricated by depositing and patterning various metal layers and via layers to form interconnects over the substrate. In an example, as described with respect to FIG. 1A, a redistribution structure 160 is fabricated over the substrate 110.

At operation 850, the fabrication of the redistribution structure forms one or more interconnects that electrically couple the first and second P—N junctions in series, and in a dual reversed junction configuration, between a further region of the substrate and one of the first and second doped wells. In an example, as described with respect to FIG. 1A, the first and second P—N junctions comprise the diodes 175, 176 electrically coupled in series between a further region 116 of the substrate 110 and the first doped well which is the P-well PW1. The diodes 175, 176 are electrically coupled in a dual reversed junction configuration where the cathodes, e.g., N-type regions, of the diodes 175, 176 are coupled together. In a further example, as described with respect to FIG. 1A, the first and second P—N junctions comprise the diodes 177, 178 electrically coupled in series between a further region 118 of the substrate 110 and the second doped well which is the N-well NW2. The diodes 177, 178 are electrically coupled in a dual reversed junction configuration where the anodes, e.g., P-type regions, of the diodes 177, 178 are coupled together. In some embodiments, as a result of operation 850, electric charges accumulated in the first or second doped well are discharged to the substrate through the described dual reversed junction, thereby avoiding or at least mitigating PID issues in subsequent manufacturing operations.

At operation 855, subsequent to operation 850, the fabrication of the redistribution structure forms an interconnect that electrically couples the gate over the first doped well to the second doped well. In an example, as described with respect to FIG. 1A, an interconnect 163 is formed to electrically couple the gate 122 or gate 132 over the first doped well, i.e., the P-well PW1 or N-well NW1, to the second doped well, i.e., the P-well PW2 or N-well NW2. The interconnect 163 is formed in an Mk layer higher than the electrical connections or interconnects described with respect to operation 850. In other words, the interconnect 163 is formed after a dual reversed junction (e.g., the PID protection circuit 171 or PID protection circuit 172) has been formed and electrically coupled between the substrate 110 and either the first doped well of a potential PID victim or the second doped well of a potential PID aggressor. Because electric charges accumulated in the first or second doped well have been discharged to the substrate as described with respect to operation 850, PID issues related to the formation of the interconnect 163 and/or subsequent interconnects are avoided or at least mitigated. In at least one embodiment, one or more further advantages described herein are achievable by an IC device manufactured by one or more of the methods 800A, 800B.

The described methods include example operations, but, unless otherwise specifically described herein, they are not necessarily required to be performed in the order shown. Operations may be added, replaced, changed order, and/or eliminated as appropriate, in accordance with the spirit and scope of embodiments of the disclosure. Embodiments that combine different features and/or different embodiments are within the scope of the disclosure and will be apparent to those of ordinary skill in the art after reviewing this disclosure.

In some embodiments, an integrated circuit (IC) device comprises a substrate, a first semiconductor device in a first doped region in the substrate, and a second semiconductor device in a second doped region in the substrate. The first doped region and the second doped region are different from each other. A gate of the first semiconductor device is electrically coupled to a source/drain of the second semiconductor device. The IC device further comprises a first protection device configured as one of a first forward diode and a first reverse diode, and a second protection device configured as the other of the first forward diode and the first reverse diode. The first forward diode and the first reverse diode are electrically coupled in series between the substrate and a doped well. The doped well is in the first doped region and a source/drain of the first semiconductor device is in the doped well. Alternatively, the doped well is in the second doped region, and the source/drain of the second semiconductor device is in the doped well.

In some embodiments, an integrated circuit (IC) device comprises a substrate, a first doped well over the substrate, a first diode over the substrate, a second diode over the substrate, a first electrical connection electrically coupling an anode or a cathode of the first diode to the first doped well, and a second electrical connection electrically coupling an anode or a cathode of the second diode to the substrate. The anodes of the first diode and the second diode are electrically coupled to each other, or the cathodes of the first diode and the second diode are electrically coupled to each other.

In a method of manufacturing an integrated circuit (IC) device in accordance with some embodiments, dopant implantations are performed to form a first doped well, a second doped well, a first P-N junction and a second P-N junction over a substrate. The substrate comprises a further region outside the first and second doped wells. A gate is deposited and patterned over the first doped well. Interconnects are deposited and patterned over the substrate to electrically couple the first and second P—N junctions in series between the further region of the substrate and one of the first and second doped wells, and then electrically couple the gate over the first doped well to the second doped well. P-type regions of the first and second P—N junctions are electrically coupled to each other, or N-type regions of the first and second P—N junctions are electrically coupled to each other.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit (IC) device, comprising:

a substrate;

a first semiconductor device in a first doped region in the substrate;

a second semiconductor device in a second doped region in the substrate, wherein the first doped region and the second doped region are different from each other, and a gate of the first semiconductor device is electrically coupled to a source/drain of the second semiconductor device;

a first protection device configured as one of a first forward diode and a first reverse diode; and a second protection device configured as the other of the first forward diode and the first reverse diode, the first forward diode and the first reverse diode electrically coupled in series between the substrate and a doped well, wherein the doped well is in the first doped region, and a source/drain of the first semiconductor device is in the doped well, or the doped well is in the second doped region, and the source/drain of the second semiconductor device is in the doped well.

2. The IC device of claim 1, wherein each of the first protection device and the second protection device comprises at least one of:

a P-type diode, an N-type diode, a diode-connected metal-oxide semiconductor (MOS) transistor, or a diode-connected bipolar junction transistor (BJT).

3. The IC device of claim 1, wherein the doped well is configured to receive a voltage higher than a voltage of the substrate, and one of the first protection device comprises a P-type diode having an anode electrically coupled to the doped well, and the second protection device comprises an N-type diode having an anode electrically coupled to the substrate, the first protection device comprises a diode-connected P-channel metal-oxide semiconductor (PMOS) transistor electrically coupled to the doped well, and the second protection device comprises a diode-connected N-channel metal-oxide semiconductor (NMOS) transistor electrically coupled to the substrate, or the first protection device comprises a diode-connected PNP bipolar junction transistor (BJT), and the second protection device comprises a diode-connected NPN BJT.

4. The IC device of claim 1, wherein the doped well is configured to receive a voltage higher than a voltage of the substrate, and one of the first protection device comprises a diode-connected P-channel metal-oxide semiconductor (PMOS) transistor electrically coupled to the doped well, and the second protection device comprises a diode having a cathode electrically coupled to the substrate, the first protection device comprises a diode having an anode electrically coupled to the doped well, and the second protection device comprises a diode-connected N-channel metal-oxide semiconductor (NMOS) transistor electrically coupled to the substrate, the first protection device comprises a diode having a cathode electrically coupled to the doped well, and the second protection device comprises a diode-connected PMOS transistor electrically coupled to the substrate, or the first protection device comprises a diode-connected NMOS transistor electrically coupled to the doped well, and the second protection device comprises a diode having an anode electrically coupled to the substrate.

5. The IC device of claim 1, wherein the doped well is configured to receive a voltage higher than a voltage of the substrate, and one of the first protection device comprises a diode-connected P-channel metal-oxide semiconductor (PMOS) transistor electrically coupled to the doped well, and the second protection device comprises a diode-connected NPN bipolar junction transistor (BJT) electrically coupled to the substrate, or the first protection device comprises a diode-connected PNP BJT electrically coupled to the doped well, and the second protection device comprises a diode-connected N-channel metal-oxide semiconductor (NMOS) transistor electrically coupled to the substrate.

6. The IC device of claim 1, wherein the doped well is configured to receive a voltage lower than a voltage of the substrate, and one of the first protection device comprises an N-type diode having an anode electrically coupled to the doped well, and the second protection device comprises a P-type diode having an anode electrically coupled to the substrate, the first protection device comprises a diode-connected N-channel metal-oxide semiconductor (NMOS) transistor electrically coupled to the doped well, and the second protection device comprises a diode-connected P-channel metal-oxide semiconductor (PMOS) transistor electrically coupled to the substrate, or the first protection device comprises a diode-connected NPN bipolar junction transistor (BJT), and the second protection device comprises a diode-connected PNP BJT.

7. The IC device of claim 1, wherein the doped well is configured to receive a voltage lower than a voltage of the substrate, and one of the first protection device comprises a diode electrically coupled to the doped well, and the second protection device comprises a diode-connected NPN bipolar junction transistor (BJT) electrically coupled to the substrate, or the first protection device comprises a diode-connected PNP BJT electrically coupled to the doped well, and the second protection device comprises a diode electrically coupled to the substrate.

8. The IC device of claim 1, wherein the doped well is configured to receive a voltage lower than a voltage of the substrate, and one of the first protection device comprises a diode-connected NPN bipolar junction transistor (BJT) electrically coupled to the doped well, and the second protection device comprises a diode-connected P-channel metal-oxide semiconductor (PMOS) transistor electrically coupled to the substrate, or the first protection device comprises a diode-connected N-channel metal-oxide semiconductor (NMOS) transistor electrically coupled to the doped well, and the second protection device comprises a diode-connected PNP BJT electrically coupled to the substrate.

9. The IC device of claim 1, wherein both of the first protection device and the second protection device are:

P-type diodes,

N-type diodes, diode-connected N-channel metal-oxide semiconductor (NMOS) transistors, diode-connected P-channel metal-oxide semiconductor (PMOS) transistors, diode-connected NPN bipolar junction transistors (BJTs), or diode-connected PNP BJTs.

10. The IC device of claim 1, wherein the doped well is a first doped well in the second doped region, the second doped region further comprises a second doped well having a conductivity opposite to the first doped well, the gate of the first semiconductor device is electrically coupled to the second doped well, and the IC device further comprises:

a second forward diode; and a second reverse diode, the second forward diode and the second reverse diode electrically coupled in series between the substrate and the second doped well.

11. The IC device of claim 1, wherein the doped well is a first doped well in the first doped region, the first doped region further comprises a second doped well having a conductivity opposite to the first doped well, and the IC device further comprises:

a third semiconductor device having a gate electrically coupled to the gate of the first semiconductor device;

a second forward diode; and a second reverse diode, the second forward diode and the second reverse diode electrically coupled in series between the substrate and the second doped well.

12. The IC device of claim 11, wherein the second doped region further comprises a third doped well, the source/drain of the second semiconductor device is in the third doped well, and the IC device further comprises:

a third forward diode; and a third reverse diode, the third forward diode and the third reverse diode electrically coupled in series between the substrate and the third doped well.

13. The IC device of claim 12, wherein the second doped region further comprises a fourth doped well having a conductivity opposite to the third doped well, the gates of the first and third semiconductor devices are electrically coupled to the fourth doped well, and the IC device further comprises:

a fourth forward diode; and a fourth reverse diode, the fourth forward diode and the fourth reverse diode electrically coupled in series between the substrate and the fourth doped well.

14. The IC device of claim 13, wherein one of the first doped well and the second doped well is a first P-well, one of the third doped well and the fourth doped well is a second P-well, and the IC device further comprises:

a first diode having an anode electrically coupled to the first P-well, and a cathode electrically coupled to the second P-well; and a second diode having an anode electrically coupled to the second P-well, and a cathode electrically coupled to the first P-well.

15. The IC device of claim 11, wherein one of the first doped well and the second doped well is a P-well, the other of the first doped well and the second doped well is an N-well, and the IC device further comprises, in the first doped region, at least one of:

a grounded-gate N-channel metal-oxide semiconductor (ggNMOS) transistor electrically coupled between the P-well and the gates of the first and third semiconductor devices, or a gate-VDD P-channel metal-oxide semiconductor (gdPMOS) transistor electrically coupled between the N-well and the gates of the first and third semiconductor devices.

16. An integrated circuit (IC) device, comprising:

a substrate;

a first semiconductor device in a first doped region in the substrate;

a second semiconductor device in a second doped region in the substrate, wherein the first doped region and the second doped region are different from each other, and a gate of the first semiconductor device is electrically coupled to a source/drain of the second semiconductor device;

a first protection device and a second protection device electrically coupled in series between the substrate and a doped well, wherein the doped well is in the first doped region, and a source/drain of the first semiconductor device is in the doped well, or the doped well is in the second doped region, and the source/drain of the second semiconductor device is in the doped well;

a first electrical connection electrically coupling the first protection device to the doped well;

a second electrical connection electrically coupling the second protection device to the substrate; and a third electrical connection electrically coupling the gate of the first semiconductor device to the source/drain of the second semiconductor device, wherein the first electrical connection and the second electrical connection are below a highest metal layer containing a conductive pattern of the third electrical connection, the first protection device is configured as one of a first forward diode and a first reverse diode, and the second protection device is configured as the other of the first forward diode and the first reverse diode.

17. The IC device of claim 16, wherein the doped well is a first doped well in the first doped region, the IC device further comprising:

a second doped well in the second doped region, wherein the source/drain of the second semiconductor device is in the second doped well;

a third protection device and a fourth protection device electrically coupled in series between the substrate and the second doped well;

a fourth electrical connection electrically coupling the third protection device to the second doped well; and a fifth electrical connection electrically coupling the fourth protection device to the substrate, wherein the fourth electrical connection and the fifth electrical connection are below the highest metal layer containing the conductive pattern of the third electrical connection.

18. The IC device of claim 16, wherein the doped well is a first doped well in the second doped region, the IC device further comprising:

a second doped well in the first doped region, wherein the source/drain of the first semiconductor device is in the second doped well;

a third protection device and a fourth protection device electrically coupled in series between the substrate and the second doped well;

a fourth electrical connection electrically coupling the third protection device to the second doped well; and a fifth electrical connection electrically coupling the fourth protection device to the substrate, wherein the fourth electrical connection and the fifth electrical connection are below the highest metal layer containing the conductive pattern of the third electrical connection.

19. The IC device of claim 16, wherein one of the first protection device and the second protection device is configured to discharge, by a leakage current, electric charges from the doped well to the substrate, and the other of the first protection device and the second protection device is configured to sustain a working voltage applied across the doped well and the substrate in operation of the IC device.

20. An integrated circuit (IC) device, comprising:

a substrate;

a first doped well in a first doped region in the substrate;

a second doped well in a second doped region in the substrate;

a first protection device comprising a first P-N junction, and configured as one of a first forward diode and a first reverse diode;

a second protection device comprising a second P-N junction, and configured as the other of the first forward diode and the first reverse diode, the first forward diode and the first reverse diode electrically coupled in series between the substrate and a doped well which is one of the first and second doped wells;

a first gate over the first doped well; and a second gate over the second doped well, wherein P-type regions of the first and second P—N junctions are electrically coupled to each other, or N-type regions of the first and second P—N junctions are electrically coupled to each other, and the first gate is electrically coupled over the first doped well to the second doped well.

* * * * *